United States Patent
Toya et al.

(10) Patent No.: US 10,236,506 B2
(45) Date of Patent: Mar. 19, 2019

(54) METHOD OF PRODUCING TRANSITION METAL COMPOSITE HYDROXIDE CAPABLE OF SERVING AS PRECURSOR OF POSITIVE ELECTRODE ACTIVE MATERIAL FOR NONAQUEOUS ELECTROLYTE SECONDARY BATTERIES AND METHOD FOR PRODUCING POSITIVE ELECTRODE ACTIVE MATERIAL FOR NANAQUEOUS ELECTROLYE SECONDARY BATTERIES

(75) Inventors: Hiroyuki Toya, Niihama (JP); Atsushi Fukui, Niihama (JP)

(73) Assignee: Sumitomo Metal Mining Co., Ltd. (JP)

( * ) Notice: Subject to any disclaimer, the term of this patent is extended or adjusted under 35 U.S.C. 154(b) by 1197 days.

(21) Appl. No.: 14/123,410

(22) PCT Filed: Sep. 2, 2011

(86) PCT No.: PCT/JP2011/069996
§ 371 (c)(1),
(2), (4) Date: Dec. 2, 2013

(87) PCT Pub. No.: WO2012/164763
PCT Pub. Date: Dec. 6, 2012

(65) Prior Publication Data
US 2014/0106228 A1    Apr. 17, 2014

(30) Foreign Application Priority Data
Jun. 1, 2011  (JP) ................. 2011-123854

(51) Int. Cl.
*H01M 4/525*   (2010.01)
*C01G 53/00*   (2006.01)
*C01G 45/00*   (2006.01)
*C01G 51/00*   (2006.01)
*H01M 4/505*   (2010.01)
*C01D 15/02*   (2006.01)
*H01M 4/485*   (2010.01)
*C30B 29/22*   (2006.01)
(Continued)

(52) U.S. Cl.
CPC ............ *H01M 4/525* (2013.01); *C01D 15/02* (2013.01); *C01G 45/006* (2013.01); *C01G 51/006* (2013.01); *C01G 53/006* (2013.01); *C01G 53/42* (2013.01); *C01G 53/50* (2013.01); *C30B 29/22* (2013.01); *H01M 2/0222* (2013.01); *H01M 2/1653* (2013.01); *H01M 4/131* (2013.01); *H01M 4/134* (2013.01); *H01M 4/382* (2013.01); *H01M 4/485* (2013.01); *H01M 4/505* (2013.01); *H01M 4/623* (2013.01); *H01M 4/625* (2013.01); *H01M 10/0525* (2013.01); *H01M 10/0568* (2013.01); *H01M 10/0569* (2013.01); *H01M 10/0585* (2013.01); *C01P 2002/52* (2013.01); *C01P 2004/01* (2013.01); *C01P 2004/51* (2013.01); *C01P 2004/61* (2013.01); *C01P 2004/84* (2013.01); *C01P 2006/12* (2013.01); *C01P 2006/40* (2013.01); *H01M 4/043* (2013.01); *H01M 4/0471* (2013.01); *H01M 4/1391* (2013.01); *H01M 2004/021* (2013.01); *H01M 2004/027* (2013.01); *H01M 2004/028* (2013.01); *H01M 2220/20* (2013.01); *H01M 2220/30* (2013.01); *Y02P 70/54* (2015.11)

(58) Field of Classification Search
CPC .... C01G 51/006; C01G 53/006; C01G 53/42; C01G 53/50; C01G 45/006; H01M 4/505; H01M 4/525; H01M 4/131; H01M 4/134; H01M 4/382; H01M 4/485; H01M 4/623; H01M 4/625; C03B 29/22; C01D 15/02
USPC .......................................... 429/223
See application file for complete search history.

(56) References Cited

U.S. PATENT DOCUMENTS 7,615,315 B2     11/2009  Tatsumi et al.
7,622,190 B2 *   11/2009  Albrecht ............. C01G 53/006
                                                  423/111

(Continued)

FOREIGN PATENT DOCUMENTS

CN     103249678     8/2013
EP     1351327      10/2003
(Continued)

OTHER PUBLICATIONS

English translation of JP 2008243448 A, Kikuchi, Oct. 2008, Japan.*

(Continued)

*Primary Examiner* — Anca Eoff
(74) *Attorney, Agent, or Firm* — Gerald E. Hespos; Michael J. Porco; Matthew T. Hespos

(57) ABSTRACT

A tranition metal composite hydroxide can be used as a precursor to allow a lithium transition metal composite oxide having a small and highly uniform particle diameter to be obtained. A method also is provided for producing a transition metal composite hydroxide represented by a general formula (1) $M_xW_sA_t(OH)_{2+\alpha}$, coated with a compound containing the additive element, and serving as a precursor of a positive electrode active material for nonaqueous electrolyte secondary batteries. The method includes producing a composite hydroxide particle, forming nuclei, growing a formed nucleus; and forming a coating material containing a metal oxide or hydroxide on the surfaces of composite hydroxide particles obtained through the upstream step.

10 Claims, 6 Drawing Sheets

(51) Int. Cl.
*H01M 2/02* (2006.01)
*H01M 2/16* (2006.01)
*H01M 4/131* (2010.01)
*H01M 4/134* (2010.01)
*H01M 4/38* (2006.01)
*H01M 4/62* (2006.01)
*H01M 10/0525* (2010.01)
*H01M 10/0568* (2010.01)
*H01M 10/0569* (2010.01)
*H01M 10/0585* (2010.01)
*H01M 4/04* (2006.01)
*H01M 4/1391* (2010.01)
*H01M 4/02* (2006.01)

(56) References Cited

U.S. PATENT DOCUMENTS

| | | | | |
|---|---|---|---|---|
| 7,625,670 | B2* | 12/2009 | Lee | H01M 4/0471 429/218.1 |
| 2003/0054251 | A1 | 3/2003 | Ohzuku et al. | |
| 2003/0129495 | A1 | 7/2003 | Yamato et al. | |
| 2004/0197658 | A1* | 10/2004 | Kase | H01M 4/525 429/231.1 |
| 2006/0081818 | A1* | 4/2006 | Ito | C01G 53/006 252/500 |
| 2006/0134521 | A1* | 6/2006 | Shima | C01G 55/002 429/231.1 |
| 2008/0233481 | A1* | 9/2008 | Kuzuo | C01G 53/006 429/223 |
| 2009/0035659 | A1* | 2/2009 | Takeuchi | H01B 1/122 429/223 |
| 2011/0217577 | A1* | 9/2011 | Fukui | H01M 10/0431 429/94 |
| 2012/0119167 | A1 | 5/2012 | Matsumoto et al. | |
| 2012/0270107 | A1 | 10/2012 | Toya et al. | |
| 2012/0276454 | A1* | 11/2012 | Mori | H01M 4/485 429/223 |
| 2014/0011090 | A1 | 1/2014 | Toya et al. | |
| 2014/0087263 | A1 | 3/2014 | Matsumoto et al. | |

FOREIGN PATENT DOCUMENTS

| | | | |
|---|---|---|---|
| EP | 2653447 | | 10/2013 |
| EP | 2752923 | | 7/2014 |
| JP | 3-252318 | | 11/1991 |
| JP | 11-16566 | | 1/1999 |
| JP | 2003-86182 | | 3/2003 |
| JP | 2003-308880 | | 10/2003 |
| JP | 2003308880 A | * | 10/2003 |
| JP | 2004-193115 | | 7/2004 |
| JP | 2005-251716 | | 9/2005 |
| JP | 2006-351487 | | 12/2006 |
| JP | 2008-147068 | | 6/2008 |
| JP | 2008-243448 | | 10/2008 |
| JP | 2008243448 A | * | 10/2008 |
| JP | 2010-40383 | | 2/2010 |
| JP | WO 2011067937 A1 | * | 6/2011 ........... H01M 4/485 |
| WO | 2005/018027 | | 2/2005 |
| WO | 2011/016372 | | 2/2011 |
| WO | 2011/067935 | | 6/2011 |

OTHER PUBLICATIONS

English translation of Sasaki JP 2003308880 A, Japan, Oct. 2003.*
Huang, A Modified Al2O3 coating process to enhance the electrochemical performance of LiNi1/3Co1/3Mn1/3O2 and its comparison with traditional Al2O3 coating process, Journal of Power Sources 196, pp. 8267-8274, Jul. 15, 2010.*
Chinese Patent Appl. No. 201180071285.2—Office Action dated Jun. 15, 2015.
European Patent App. No. 11866738—Search Report dated Jan. 20, 2015.
International Search Report dated Dec. 6, 2011.

* cited by examiner

METHOD OF PRODUCING TRANSITION METAL COMPOSITE HYDROXIDE CAPABLE OF SERVING AS PRECURSOR OF POSITIVE ELECTRODE ACTIVE MATERIAL FOR NONAQUEOUS ELECTROLYTE SECONDARY BATTERIES AND METHOD FOR PRODUCING POSITIVE ELECTRODE ACTIVE MATERIAL FOR NANAQUEOUS ELECTROLYE SECONDARY BATTERIES

BACKGROUND

1. Field of the Invention

The present invention relates to a transition metal composite hydroxide capable of serving as a precursor of a positive electrode active material for nonaqueous electrolyte secondary batteries, a method for producing the same, the positive electrode active material for nonaqueous electrolyte secondary batteries, a method for producing the positive electrode active material for nonaqueous electrolyte secondary batteries, and a nonaqueous electrolyte secondary battery using said positive electrode active material.

2. Description of the Related Art

In recent years, with the spread of portable electronic equipment, such as cell phones and notebook-sized personal computers, development of a small and lightweight nonaqueous electrolyte secondary battery having a high energy density has been strongly desired. Also, development of a high-output secondary battery as a battery of a power source for driving motors, particularly a power source for transport equipment, has been strongly desired.

As such a secondary battery, there is a lithium-ion secondary battery. The lithium-ion secondary battery comprises a negative electrode, a positive electrode, an electrolyte solution, and the like, and, as active materials of the negative electrode and the positive electrode, materials capable of desorption and insertion of lithium are used. At present, research and development of such lithium-ion secondary battery are being actively conducted, and particularly, since a 4V class high voltage can be achieved by a lithium-ion secondary battery using a lithium metal composite oxide having a layered or spinel structure as a positive electrode material, the commercialization thereof as a battery having a high energy density is progressing.

As a material which has been mainly proposed until now, it may include lithium-cobalt composite oxide ($LiCoO_2$), which is relatively easily synthesized; lithium-nickel composite oxide ($LiNiO_2$), in which nickel, more inexpensive than cobalt, is used; lithium-nickel-cobalt-manganese composite oxide ($LiNi_{1/3}Co_{1/3}Mn_{1/3}O_2$); lithium-manganese composite oxide ($LiMn_2O_4$), in which manganese is used; and the like. Among these, lithium-nickel-cobalt-manganese composite oxide has been highlighted as a material having excellent cycle characteristics and providing high output with low resistance.

In order to achieve such good performance, it is required to use a lithium composite oxide having a uniform particle diameter as a positive electrode active material.

The reason for this is that use of a composite oxide having a wide particle size distribution causes unevenness of voltage applied to particles in an electrode, whereby fine particles selectively degrade when charge and discharge are repeated, and cycle deterioration is easily caused. Therefore, in order to improve the performance of a positive electrode material, it is important to produce a lithium composite oxide having a small and uniform particle diameter as a positive electrode active material.

In other words, a lithium composite oxide is usually produced from a composite hydroxide, and therefore, in order to improve the performance of a positive electrode material and produce a lithium-ion secondary battery having high performance as a final product, a composite hydroxide including particles having a small particle diameter and a narrow particle size distribution needs to be used as a composite hydroxide to be used as a raw material of a lithium composite oxide constituting a positive electrode material.

As for a particle size distribution of a lithium composite oxide, for example, Japanese Patent Application Laid-Open No. 2008-147068 discloses a lithium composite oxide, the lithium composite oxide being particles having a particle size distribution wherein, in a particle size distribution curve, an average particle diameter D50, which represents a particle diameter having a cumulative frequency of 50%, is 3 to 15 μm, a minimum particle diameter is not less than 0.5 μm, and a maximum particle diameter is not more than 50 μm, and furthermore, in a relationship between D50 and D10 as well as D50 and D90, the D10 having a cumulative frequency of 10% and the D90 having a cumulative frequency of 90%, D10/D50 and D10/D90 are 0.60 to 0.90 and 0.30 to 0.70, respectively. It is also disclosed that this lithium composite oxide has a high density, is excellent in charge-and-discharge capacity characteristics and output characteristics, and is resistant to degradation even under heavy charge-and-discharge load conditions, and therefore use of the lithium composite oxide allows a lithium ion nonaqueous electrolyte secondary battery having excellent output characteristics and less degradation of cycle characteristics to be obtained.

However, the lithium composite oxide disclosed in Japanese Patent Application Laid-Open No. 2008-147068 has an average particle diameter of 3 to 15 μm while having a minimum particle diameter of not less than 0.5 μm and a maximum particle diameter of not more than 50 μm, and hence includes very fine particles and coarse particles.

Moreover, it cannot be said that such particle size distribution specified by the above-mentioned D10/D50 and D10/D90 is a narrow particle size distribution.

In other words, it cannot be said that the lithium composite oxide disclosed in Japanese Patent Application Laid-Open No. 2008-147068 is particles having sufficiently high uniformity of particle diameters, and hence, even if such lithium composite oxide is adopted, improvement in performance of a positive electrode material cannot be expected, and it is difficult to obtain a lithium ion nonaqueous electrolyte secondary battery having sufficiently high performance.

Also, there has been proposed a method of producing a composite hydroxide to be used as a raw material of composite oxide, in order to improve a particle size distribution. Japanese Patent Application Laid-Open No. 2003-86182 proposes a method of producing a positive electrode active material for nonaqueous electrolyte batteries, wherein an alkaline solution is introduced together with an aqueous solution containing two or more of transition metal salts or two kinds or more of aqueous solutions of different transition metal salts into a reaction vessel to obtain a hydroxide or an oxide as a precursor through coprecipitation with a reductant being coexistent or an inert gas being supplied.

However, the technique disclosed in Japanese Patent Application Laid-Open No. 2003-86182 aims to classify and collect formed crystals, and therefore, in order to obtain a product having a uniform particle diameter, production conditions need to be strictly controlled and it is hard to implement an industrial scale production. In addition, even if crystal particles having a large particle diameter can be obtained, it is difficult to obtain particles having a small particle diameter.

Further, in recent years, there have been made efforts to further improve the performance by adding various elements. Tungsten acts to reduce reaction resistance, whereby the effect of achieving high-output can be expected. For example, Japanese Patent Application Laid-Open No. H11-16566 proposes a positive electrode active material which is coated with a metal containing at least one element selected from the group consisting of Ti, Al, Sn, Bi, Cu, Si, Ga, W, Zr, B, and Mo and/or an intermetallic compound obtained by a combination of a plurality of the above mentioned elements, and/or an oxide. Japanese Patent Application Laid-Open No. H11-16566 describes that such coating enables oxygen gas to be absorbed and safety to be secured, but does not disclose output characteristics at all. Moreover, the disclosed manufacturing method is coating using a planetary ball mill, and such coating method gives physical damages to the positive electrode active material, and causes decrease in battery characteristics.

Japanese Patent Application Laid-Open No. 2005-251716 proposes a positive electrode active material for nonaqueous electrolyte secondary batteries, the positive electrode active material having at least a lithium transition metal composite oxide having a layered structure, wherein the lithium transition metal composite oxide exists in a particle form comprising either or both of primary particles and secondary particles composed of aggregation of the primary particles, and has a compound comprising at least one element selected from the group consisting of molybdenum, vanadium, tungsten, boron, and fluorine, at least on the surface of said particles.

Thus, Japanese Patent Application Laid-Open No. 2005-251716 provides a positive electrode active material for nonaqueous electrolyte secondary batteries, the positive electrode active material demonstrating excellent battery characteristics even under severer environment conditions for use, and particularly, describes the improvement of initial characteristics without loss of improvements in thermal stability, load characteristics, and output characteristics since the positive electrode active material has, on the surface of the particles, a compound comprising at least one selected from the group consisting of molybdenum, vanadium, tungsten, boron, and fluorine.

However, Japanese Patent Application Laid-Open No. 2005-251716 describes that the effect of at least one addition element selected from the group consisting of molybdenum, vanadium, tungsten, boron, and fluorine exists in improvement in initial characteristics, that is, initial discharge capacity and initial efficiency, and thus it does not refer to output characteristics. Also according to the disclosed manufacturing method, the addition element is mixed and burned with a hydroxide which has been heat-treated simultaneously together with a lithium compound, and therefore there is a problem that a part of the addition element substitutes for nickel which has been arranged in layers, whereby battery characteristics decrease.

In view of such problems, the present invention aims to provide a transition metal composite hydroxide, the use of which as a precursor allows a lithium transition metal composite oxide having a small particle diameter and high uniformity of particle diameters to be obtained.

Also, the present invention aims to provide a positive electrode active material for nonaqueous secondary batteries, the positive electrode active material being capable of reducing positive electrode resistance values measured when used for batteries, and also to provide a nonaqueous electrolyte secondary battery including said positive electrode active material, the secondary battery having high capacity and thermal safety, and achieving high output.

Furthermore, the present invention aims to provide a method for industrially producing the transition metal composite hydroxide and the positive electrode active material according to the present invention.

SUMMARY OF THE INVENTION

The present inventors earnestly studied about a lithium transition metal composite oxide which can demonstrate excellent battery characteristics when used as a positive electrode material for a lithium-ion secondary battery, and, as a result, they obtained a view that separation into a nucleation stage and a particle growth stage by pH control in crystallization allows a particle size distribution of the transition metal composite hydroxide to be controlled. Also, the present inventors obtained another view that a crystallized material is held in a slurry in which at least a tungsten compound is dissolved, and pH is controlled, whereby there is obtained a composite hydroxide on the particle surface of which a tungsten-coated material is formed, and the use of said composite hydroxide as a precursor allows a positive electrode active material capable of achieving high capacity and high output of a battery to be obtained. The present invention was completed based on these views.

Specifically, a first aspect of the present invention is to provide a method of producing a transition metal composite hydroxide, the transition metal composite hydroxide being represented by a general formula (1) $M_xW_sA_t(OH)_{2+\alpha}$ (wherein, $x+s+t=1$, $0<s\leq0.05$, $0<s+t\leq0.15$, $0\leq\alpha\leq0.5$, M is at least one transition metal element selected from Ni, Co and Mn, and A is at least one additive element selected from transition metal elements other than M and W, group 2 elements, and group 13 elements), being coated with a compound containing the additive element, and serving as a precursor of a positive electrode active material for nonaqueous electrolyte secondary batteries, the method comprising: a composite hydroxide particle production step including a nucleation stage and a particle growth stage, the nucleation stage being such that a solution for nucleation containing a metal compound having an atomic ratio of transition metals corresponding to an atomic ratio of M in the transition metal composite hydroxide, and an ammonium ion supply source is controlled to have a pH of 12.0 to 14.0 at a reference solution temperature of 25 degrees C., whereby nuclei are formed, the particle growth stage being such that a solution for particle growth containing nuclei formed at the nucleation stage is controlled to have a pH of 10.5 to 12.0 at a reference solution temperature of 25 degrees C. so as to be lower than the pH at the nucleation stage, whereby the formed nuclei are grown; and a coating step wherein composite hydroxide particles obtained in the particle production step are mixed with a solution containing at least a tungsten compound to make a slurry, and the slurry is controlled to have a pH of 7 to 9 at a reference solution temperature of 25 degrees C., whereby a coating material containing a metal oxide of tungsten and the additive element or a metal hydroxide of tungsten and the additive element is formed on surfaces of the obtained composite hydroxide particles.

A second aspect of the present invention is such that the additive element according to the first aspect is at least one element selected from B, Al, Sc, Y, Ti, Zr, Hf, V, Nb, Ta, Cr, and Mo, and a third aspect of the present invention is such that the additive element preferably includes at least Al.

A fourth aspect of the present invention is such that the tungsten compound according to the first to third aspects is preferably either or both of ammonium tungstate and sodium tungstate.

A fifth aspect of the present invention is characterized in that, in the coating step according to the fourth aspect, the tungsten compound is ammonium tungstate, and ammonia contained in a 25% ammonia solution in an amount equivalent to 0.5 to 25% by volume of an ammonium tungstate saturated solution is added to the slurry.

A sixth aspect of the present invention is characterized in that, in the coating step according to the third to fifth aspects, sodium aluminate is added to the slurry, and a seventh aspect of the present invention is to provide a method of producing a transition metal composite hydroxide, wherein, in the coating step according to the sixth aspect, pH is controlled by adding a sulfuric acid to the slurry thereby to precipitate a tungsten compound and an aluminum compound simultaneously and to coat a surface of the composite hydroxide.

An eighth aspect of the present invention is to provide a transition metal composite hydroxide represented by a general formula (1) $M_xW_sA_t(OH)_{2+\alpha}$ (wherein, $x+s+t=1$, $0<s\leq0.05$, $0<s+t\leq0.15$, $0\leq\alpha\leq0.5$, M is at least one transition metal selected from Ni, Co and Mn, and A is at least one additive element selected from transition metal elements other than M and W, group 2 elements, and group 13 elements) and serving as a precursor of a positive electrode active material for nonaqueous electrolyte secondary batteries, wherein the transition metal composite hydroxide is secondary particles having a substantially spherical shape and composed of aggregation of a plurality of primary particles, the secondary particles have an average particle diameter of 3 to 7 μm and an index indicating a scale of particle-size distribution, [(d90−d10)/average-particle-diameter], of not more than 0.55, and a coating material containing a metal oxide of tungsten and the additive element or a metal hydroxide of tungsten and the additive element is formed on surfaces of the secondary particles.

A ninth aspect of the present invention is characterized in that the transition metal composite hydroxide according to the eighth aspect has a specific surface area of 5 to 30 m2/g.

A tenth aspect of the present invention is characterized in that the additive element according to the eighth and ninth aspects is at least one element selected from B, Al, Sc, Y, Ti, Zr, Hf, V, Nb, Ta, Cr, and Mo, and an eleventh aspect of the present invention is to provide a transition metal composite hydroxide, wherein s+t in the general formula (1) according to the eighth to tenth aspects is $0.02<s+t\leq0.15$.

A twelfth aspect of the present invention is to provide a transition metal composite hydroxide, wherein the coating material according to the tenth to eleventh aspects is a mixture containing a tungsten oxide hydrate and an aluminum hydroxide.

A thirteenth aspect of the present invention is to provide a method of producing a positive electrode active material for nonaqueous electrolyte secondary batteries, the positive electrode active material comprising a lithium transition metal composite oxide represented by a general formula (2) $Li_{1+u}M_xW_sA_tO_2$ (wherein, $-0.05\leq u\leq0.50$, $x+s+t=1$, $0<s\leq0.05$, $0<s+t\leq0.15$, M is at least one transition metal selected from Ni, Co and Mn, and A is at least one additive element selected from transition metal elements other than M and W, group 2 elements, and group 13 elements) and having a layered hexagonal crystal structure, the method comprising: a hydroxide particle production step of obtaining a transition metal composite hydroxide by the production method according to any one of the first to fourth aspect; a mixing step of mixing the transition metal composite hydroxide with a lithium compound to form a lithium mixture; and a burning step of burning the lithium mixture formed in the mixing step under an oxidizing atmosphere at a temperature of 700 to 1000 degrees C.

A fourteenth aspect of the present invention is to provide a method of producing a positive electrode active material for nonaqueous electrolyte secondary batteries, wherein the lithium mixture according to the thirteenth aspect is adjusted so that a ratio of a total number of atoms of metals contained in the lithium mixture other than lithium to the number of atoms of lithium contained therein is 1:0.95 to 1:1.5.

A fifteenth aspect of the present invention is to provide a method of producing a positive electrode active material for nonaqueous electrolyte secondary batteries, wherein, in the burning step according to the thirteenth aspect, calcination is performed in advance at a temperature of 350 to 800 degrees C.

A sixteenth aspect of the present invention is to provide a positive electrode active material for nonaqueous electrolyte secondary batteries, the positive electrode active material comprising a lithium transition metal composite oxide represented by a general formula (2) $Li_{1+u}M_xW_sA_tO_2$ (wherein, $-0.05\leq u\leq0.50$, $x+s+t=1$, $0<s\leq0.05$, $0<s+t\leq0.15$, M is at least one transition metal selected from Ni, Co and Mn, and A is at least one additive element selected from transition metal elements other than M and W, group 2 elements, and group 13 elements) and having a layered hexagonal crystal structure, wherein the positive electrode active material has an average particle diameter of 3 to 8 μm and an index indicating a scale of particle-size distribution, [(d90−d10)/average-particle-diameter], of not more than 0.60.

A seventeenth aspect of the present invention is characterized in that the positive electrode active material for nonaqueous electrolyte secondary batteries according to the sixteenth aspect has a specific surface area of 0.5 to 2.0 m2/g.

An eighteenth aspect of the present invention is to provide a positive electrode active material for nonaqueous electrolyte secondary batteries, wherein the additive element according to the sixteenth and seventeenth aspects is at least one element selected from B, Al, Sc, Y, Ti, Zr, Hf, V, Nb, Ta, Cr, and Mo, and furthermore, according to a nineteenth aspect of the present invention, the additive element preferably includes at least Al.

A twentieth aspect of the present invention is to provide a positive electrode active material for nonaqueous electrolyte secondary batteries, wherein M in the general formula (2) according to the sixteenth to nineteenth aspects includes at least Ni and Co, and a twenty-first aspect of the present invention is to provide a positive electrode active material for nonaqueous electrolyte secondary batteries, wherein M in the general formula (2) according to the sixteenth to nineteenth aspects includes at least Ni and Mn.

A twenty-second aspect of the present invention is to provide a positive electrode active material for nonaqueous electrolyte secondary batteries, wherein s+t in the general formula (2) according to the sixteenth to nineteenth aspects is $0.02<s+t\leq0.15$.

A twenty-third aspect of the present invention is to provide a nonaqueous electrolyte secondary battery, wherein a positive electrode is formed of the positive electrode active material for nonaqueous electrolyte secondary batteries according to the sixteenth to twenty-second aspects.

ADVANTAGEOUS EFFECTS OF INVENTION

According to the present invention, a monodisperese transition metal composite hydroxide having a small particle diameter and a narrow particle size distribution can be obtained, and a positive electrode active material which comprises a lithium transition metal composite oxide and obtained in the case where the obtained transition metal composite hydroxide is used as a precursor is capable of achieving a nonaqueous secondary battery having high-capacity, high temperature stability, and high-output, and a nonaqueous electrolyte secondary battery composed of a positive electrode including said positive electrode active material can have excellent battery characteristics.

The method of producing a transition metal composite hydroxide and the method of producing a positive electrode active material according to the present invention each are easy and suitable for industrial scale manufacturing, and accordingly have a great industrial value.

DETAILED DESCRIPTION OF THE PREFERRED EMBODIMENTS

Figure 1:
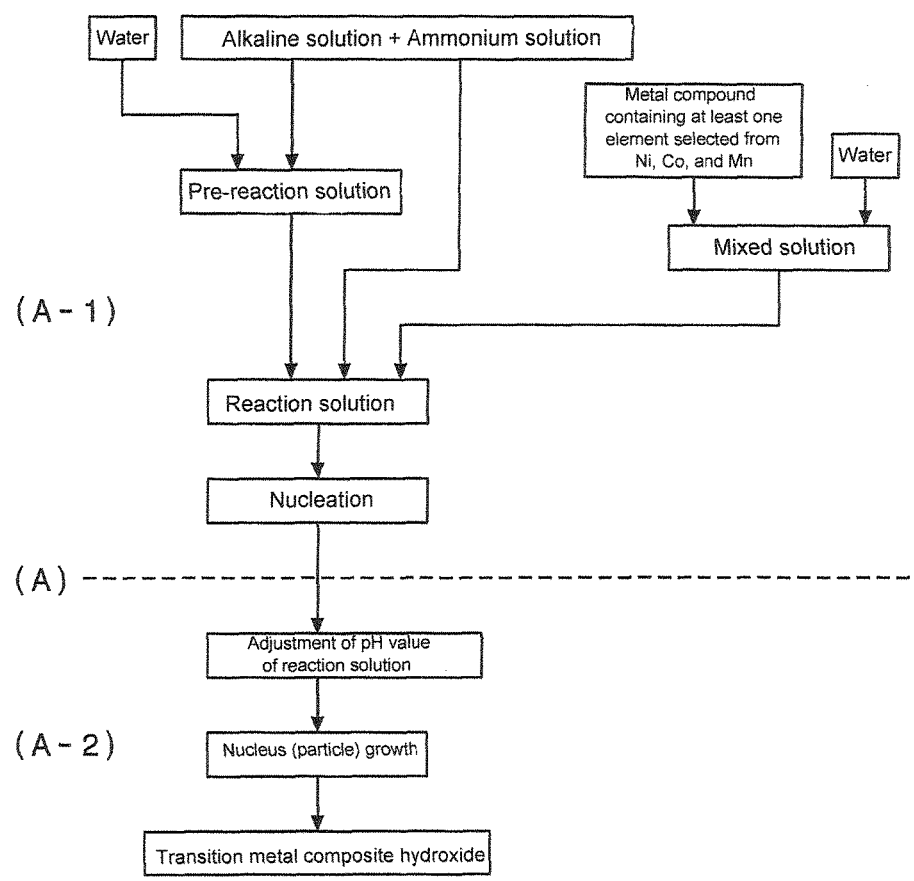
FIG. 1 is a schematic flow chart illustrating a process of producing a transition metal composite hydroxide according to the present invention.

The present invention relates to the following inventions.
1. A transition metal composite hydroxide which serves as a precursor of a positive electrode active material for non-aqueous electrolyte secondary batteries, and a method of producing the same.
2. A positive electrode active material for nonaqueous electrolyte secondary batteries, the positive electrode active material including the transition metal composite hydroxide described in the above-mentioned invention 1, and a method of producing the positive electrode active material.
3. A nonaqueous electrolyte secondary battery formed using the positive electrode active material described in the above-mentioned invention 2.

Hereinafter, the above-mentioned inventions 1 to 3 will be explained in detail, namely, (1) a transition metal composite hydroxide and a method of producing the same will be explained first, and then, (2) a positive electrode active material for nonaqueous electrolyte secondary batteries, the positive electrode active material using the transition metal composite hydroxide as a precursor, and a method of producing the positive electrode active material, and lastly, (3) a nonaqueous electrolyte secondary battery as a final product will be explained.

1-1. Transition Metal Composite Hydroxide

A transition metal composite hydroxide according to the present invention (hereinafter, simply referred to as composite hydroxide according to the present invention) is represented by a general formula (1) $M_xW_sA_t(OH)_{2+\alpha}$ (wherein, $x+s+t=1$, $0<s\leq0.05$, $0<s+t\leq0.15$, $0\leq\alpha\leq0.5$, M is at least one transition metal selected from Ni, Co and Mn, and A is at least one additive element selected from transition metal elements other than M and W, group 2 elements, and group 13 elements) and is secondary particles having a substantially spherical shape and composed of aggregation of a plurality of primary particles, wherein the secondary particles have an average particle diameter of 3 to 7 μm and an index indicating a scale of particle-size distribution, $[(d_{90}-d_{10})/\text{average-particle-diameter}]$, of not more than 0.55, and a coating material containing a metal oxide of tungsten and the additive element or a metal hydroxide of tungsten and the additive element is formed on surfaces of the secondary particles.

The composite hydroxide according to the present invention is particularly suitable as a precursor of the positive electrode active material according to the present invention.

Hereinafter, an explanation will be given based on the premise that the composite hydroxide is used as a precursor of the positive electrode active material according to the present invention.

[Particle Structure]

The composite hydroxide according to the present invention is adjusted so as to comprise substantially-spherical-shaped particles, specifically secondary particles having a substantially spherical shape and composed of aggregation of a plurality of primary particles. Such a structure allows lithium to be sufficiently diffused into the particles in a sintering process for forming a positive electrode active material according to the present invention, whereby a positive electrode active material having a uniform and good distribution of lithium is formed.

Furthermore, it is more preferable that the primary particles are aggregated in a random direction to form secondary particles.

The aggregation of the primary particles in a random direction allows voids to be formed almost uniformly between the primary particles, and therefore, when the secondary particles are mixed with a lithium compound and burned, the melted lithium compound spreads into the secondary particles, and lithium is thus sufficiently diffused.

[Particle Size Distribution]

The composite hydroxide according to the present invention is adjusted so as to have an index indicating a scale of particle-size distribution, $[(d90-d10)/\text{average-particle-diameter}]$, of not more than 0.55.

A particle size distribution of a positive electrode active material is strongly affected by a raw material, that is, a composite hydroxide, and therefore, in the case where fine particles or coarse particles are mixed in the composite hydroxide, then the positive electrode active material also includes the same type of particles.

In other words, if a composite hydroxide has $[(d90-d10)/\text{average-particle-diameter}]$ of more than 0.55 to become a wider particle size distribution, then a positive electrode active material also includes fine particles or coarse particles.

Also, in the case where a positive electrode is formed using a positive electrode active material including many fine particles, a local reaction of the fine particles may cause heat generation, and accordingly safety is lowered and also the fine particles are selectively degraded, whereby cycle characteristics are worsened.

On the other hand, in the case where a positive electrode is formed using a positive electrode active material including many particles having a large diameter, a reaction area of an electrolyte solution with the positive electrode active material cannot be sufficiently secured, whereby an increase in reaction resistance causes a decrease in battery output.

By the adjustment of the composite hydroxide according to the present invention so as to have an index [(d90−d10)/average-particle-diameter] of not more than 0.55, a positive electrode active material obtained by using the composite hydroxide according to the present invention as a raw material also have a narrower range of a particle size distribution and have a uniform particle diameter.

In other words, a positive electrode active material to be obtained can have an index [($d_{90}$−$d_{10}$)/average-particle-diameter] of not more than 0.6 in a particle size distribution thereof. Thus, a battery which has an electrode formed with the positive electrode active material obtained using the composite hydroxide according to the present invention as a raw material is allowed to have good cycle characteristics and high-output.

Here, it may be considered that composite hydroxide particles having a wide normal-distribution are classified to obtain a composite hydroxide having a narrower particle-size distribution, but there is no sieve having an opening capable of being used for particles having the same level of average particle diameter as that of the composite hydroxide particles according to the present invention, and thus classification using a sieve is difficult. Also, even using an apparatus such as a wet cyclone, the particles cannot be classified so as to have a sufficiently narrow particle-size distribution, and thus it is difficult to obtain a composite hydroxide having a uniform particle diameter and a narrow particle-size distribution, by an industrial classification method.

As an example, using a cylinder type reaction vessel equipped with a stirrer and a overflow pipe, a mixed solution of nickel sulfate and cobalt sulfate of a composition ratio, and aqueous ammonia were added to the reaction vessel, whereby pH was controlled to 11.5 to 12.0, and after a state inside the reaction vessel became stationary, composite hydroxide particles having a composition of Ni0.85Co0.15 (OH)2 were continuously collected from the overflow pipe. Using a wet cyclone (hydrocyclone, NHC-1, manufactured by Japan Chemical Engineering & Machinery Co., Ltd.), supply pressure was increased to remove coarse powder from the obtained composite hydroxide particles, and then the supply pressure was reduced to remove fine particles therefrom. However, only composite hydroxide particles having an average particle diameter of 6.5 and [(d90−d10)/average-particle-diameter] of 0.65 were obtained.

Note that, in an index indicating a scale of a particle-size distribution, that is, [(d90−d10)/average-particle-diameter], d10 represents a particle diameter obtained at the point in time when the number of particles in each particle diameter is accumulated in the order from small particle diameter and an accumulated volume thereof reaches 10% of a total volume of all the particles. On the other hand, d90 represents a particle diameter obtained at the point in time when the number of particles is accumulated in the same way as mentioned above and an accumulated volume thereof reaches 90% of a total volume of all the particles.

Methods of calculating an average particle diameter (d50), d90, and d10 are not particularly limited, but, for example, they can be obtained from an integrated value of volume measured with a laser diffraction scattering type particle-size analyzer.

[Average Particle Diameter]

The composite hydroxide according to the present invention is adjusted to have an average particle diameter of 3 to 7 μm.

By the adjustment of the average particle diameter to 3 to 7 μm, a positive electrode active material formed using the composite hydroxide according to the present invention as a precursor also can be adjusted to have a predetermined average particle diameter (3 to 8 μm), whereby a desirable positive electrode active material can be formed.

Here, in the case where the composite hydroxide has an average particle diameter of less than 3 μm, the positive electrode active material formed also has a small average particle diameter, and filling density in a positive electrode is lowered, whereby a battery capacity per volume is reduced. In addition, the positive electrode active material sometimes has a too large specific surface area. On the other hand, in the case where the composite hydroxide has an average particle diameter of more than 7 μm, a specific surface area of the positive electrode active material is decreased to reduce an interface with an electrolyte solution, whereby resistance of a positive electrode is increased to cause reduction in output characteristics of a battery.

Therefore, the composite hydroxide according to the present invention is adjusted to have an average particle diameter of 3 to 7 um, and using this adjusted composite hydroxide as a raw material, the positive electrode active material according to the present invention can be formed, and when a positive electrode using this positive electrode active material is applied to a battery, excellent battery characteristics can be achieved.

[Specific Surface Area]

The composite hydroxide according to the present invention is adjusted to have a specific surface area of 5 to 30 m2/g.

The control of said specific surface area of 5 to 30 m2/g allows a positive electrode active material formed using the composite hydroxide according to the present invention as a precursor to have a predetermined specific surface area (0.5 to 2.0 m2/g).

Here, in the case where the composite hydroxide has a specific surface area of less than 5 m2/g, the positive electrode active material formed has a small specific surface area, and accordingly, not only output characteristics of a battery are sometimes reduced, but also a reaction in burning after mixing with a lithium compound sometimes insufficiently proceeds.

On the other hand, in the case where the composite hydroxide has a specific surface area of more than 30 m2/g, the positive electrode active material has a too large specific surface area, and accordingly, not only heat stability of the positive electrode active material is sometimes lowered, but also sintering of the particles in the burning proceeds, whereby coarse particles are sometimes formed.

[Composition of Composite Hydroxide]

The composite hydroxide according to the present invention is adjusted to have a composition expressed by a general formula (1) shown below.

In the case where a lithium transition metal composite oxide is produced using the composite hydroxide having such composition as a precursor, when an electrode using this lithium transition metal composite oxide as a positive electrode active material is applied to a battery, a value of positive electrode resistance to be measured can be made lower and good output characteristics of a battery can be achieved.

[Chemical Formula 1]

$$M_xW_sA_t(OH)_{2+\alpha} \quad (1)$$

wherein, x+s+t=1, 0<s≤0.05, 0<s+t≤0.15, 0≤α≤0.5,

M is at least one transition metal selected from Ni, Co and Mn, and

A is at least one additive element selected from transition metal elements other than M and W, group 2 elements, and group 13 elements.

The composite hydroxide according to the present invention may have a composition capable to be a precursor of a lithium transition metal composite oxide, but specifically, the composite hydroxide represented by the following general formula (1-1) or (1-2) is preferable.

[Chemical Formula 2]

$$Ni_{1-x-s-t}Co_xW_sA_t(OH)_{2+\alpha} \quad (1\text{-}1)$$

wherein,

0≤x≤0.2, 0<s≤0.05, 0<s+t≤0.15, x+s+t<0.3, 0≤α≤0.5, and

A is at least one additive element selected from transition metal elements other than Ni, Co and W, group 2 elements, and group 13 elements.

[Chemical Formula 3]

$$Ni_xMn_yCo_zW_sA_t(OH)_{2+\alpha} \quad (1\text{-}2)$$

wherein, x+y+z+s+t=1, 0.3≤x≤0.7, 0.1≤y≤0.55, 0≤z≤0.4, 0<s≤0.05, 0<s+t≤0.15, 0≤α≤0.5, and A is at least one additive element selected from transition metal elements other than Ni, Co, Mn and W, group 2 elements, and group 13 elements.

In the case where a positive electrode active material is obtained by using the above-mentioned composite hydroxide as a precursor, the positive electrode active material comes to have the same composition ratio as that of the composite hydroxide. Therefore, the composite hydroxide according to the present invention is adjusted so as to have the same composition ratio as that of the positive electrode active material to be obtained.

[Particle Structure]

In the composite hydroxide according to the present invention, a coating material containing a metal oxide of tungsten and the additive element or a metal hydroxide of tungsten and the additive element is formed on surfaces of the composite hydroxide particles.

Thus, a positive electrode active material can be mase to contain tungsten and an additive element uniformly. If it is aimed to make a positive electrode active material contain tungsten and an additive element, it may be enough only to partially form a coating material on the surfaces of composite hydroxide particles, but, in order to control variation of amounts of tungsten and the additive element contained in each particle of a positive electrode active material, it is preferable to make a coating material uniformly adhere to surfaces of composite hydroxide particles and thereby to form a thin coating layer.

Furthermore, in the case where a total amount of tungsten and an additive element contained is small, a coating layer may be formed as a metal oxide or a metal hydroxide in which a transition metal contained as M in the above-mentioned general formula (1) is mixed with tungsten and the additive element.

Thus, even if an amount of tungsten and an additive element is small, a content thereof in each particle can be controlled to be uniform.

Also, in the case where aluminum is selected as an additive element in order to improve thermal stability, the coating material is preferably a mixture containing tungsten oxide hydrate and aluminum hydroxide. Thus, a synergic effect of tungsten and aluminum makes it possible to improve output characteristics and thermal stability of a battery.

1-2. Method of Producing Transition Metal Composite Hydroxide

The composite hydroxide according to the present invention having the above-mentioned characteristics is produced by the following method.

The method of producing the composite hydroxide according to the present invention is such that a coating material containing tungsten and an additive element is formed on the surfaces of transition metal composite hydroxide particles obtained by a crystallization reaction, whereby the composite hydroxide is produced, the method comprising:

(A) a composite hydroxide particle production step including (A-1) a nucleation stage of performing nucleation and (A-2) a particle growth stage of growing up a nucleus formed at the nucleation stage; and (B) a coating step of forming a coating material containing a metal oxide of tungsten and the additive element or a metal hydroxide of tungsten and the additive element on the surfaces of said composite hydroxide particles.

In other words, in a continuous crystallization method of the prior art, a nucleation reaction and a particle growth reaction proceed in the same vessel at the same time, whereby a particle size distribution range is wider. On the other hand, the method of producing a composite hydroxide according to the present invention is to clearly separate a time when a nucleation reaction mainly occurs (nucleation step) from a time when a particle growth reaction mainly occurs (particle growth step), thereby achieving a narrow particle size distribution.

Furthermore, the method is characterized in that a coating material containing a metal oxide of tungsten and the additive element or a metal hydroxide of tungsten and the additive element is formed uniformly on the surfaces of the composite hydroxide particles obtained in the particle production step.

First, an outline about the production method of the composite hydroxide according to the present invention will be explained based on FIG. 1. Note that, in FIG. 1 and FIG. 2, the combination of (A-1) the nucleation stage and (A-2) the particle growth stage corresponds to (A) the composite hydroxide particle production step.

(A) Composite Hydroxide Particle Production Step (A-1) Nucleation Stage

As illustrated in FIG. 1, first, a plurality of metal compounds containing at least one transition metal selected from Ni, Co, and Mn is dissolved in water at a predetermined ratio to produce a mixed solution. In the method of producing a composite hydroxide according to the present invention, a metal composition ratio in the composite hydroxide particles obtained is the same as the metal composition ratio in the mixed solution. Therefore, the metal ratio of the metal compounds to be dissolved in water is adjusted so that the mixed solution has the same metal composition ratio as the composite hydroxide according to the present invention, whereby this mixed solution is produced.

On the other hand, an alkaline solution, such as a sodium hydroxide solution, an ammonia solution containing an ammonium ion supply source, and water are fed into a reaction vessel and mixed to form a solution.

Such a solution (hereinafter referred to as a pre-reaction solution) is adjusted to have a pH of 12.0 to 14.0 at a reference solution temperature of 25 degrees C. after adjustment of a feeding amount of the alkaline solution. In addition, the pre-reaction solution is adjusted to have an ammonium ion concentration of 3 to 25 g/L. Furthermore, the pre-reaction solution is adjusted to have a temperature of 20 to 60 degrees C. Note that the pH value and the ammonium ion concentration of the solution in the reaction vessel are measured by a common pH meter and a common ion meter, respectively.

Then, after adjusting the temperature and the pH value of the pre-reaction solution, with the pre-reaction solution being stirred, the mixed solution is fed into the reaction vessel. Thus, a solution (hereinafter referred to as a reaction solution) obtained by mixing the pre-reaction solution with the mixed solution is formed in the reaction vessel, whereby very fine nuclei of composite hydroxide particles according to the present invention can be formed in the reaction solution. At this time, the reaction solution has a pH value in the above-mentioned range, and therefore the formed nuclei hardly grow, and nucleation occurs on a priority basis.

Note that as the nucleation by feeding the mixed solution proceeds, the pH value and the ammonium ion concentration of the reaction solution vary, and therefore, besides the mixed solution, the alkaline solution and the ammonia solution are fed into the reaction solution, whereby the reaction solution is controlled so that the pH value and the ammonium ion concentration of the reaction solution each are maintained at the corresponding predetermined value.

Thus, the feeding of the mixed solution, the alkaline solution, and the ammonia solution into the reaction solution allows a new nucleus to be formed continuously in the reaction solution. Then, when a predetermined amount of nuclei is formed in the reaction solution, the nucleation stage is completed. Whether the predetermined amount of nuclei is formed or not is determined with an amount of metal salt added to the reaction solution.

This reaction solution, that is, a solution being obtained by mixing the mixed solution with the alkaline solution and the ammonia solution and being adjusted to have a pH of 12.0 to 14.0, is a claimed solution for nucleation.

(A-2) Particle Growth Stage

After completion of the nucleation stage, the reaction solution is adjusted so as to have a pH value lower than the pH value at the nucleation stage within a pH range of 10.5 to 12.0 at a reference solution temperature of 25 degrees C. Specifically, the pH value of the reaction solution is controlled by adjusting a feeding amount of the alkaline solution.

When the pH value of the reaction solution is controlled to be within the above-mentioned range, the nuclear growth reaction occurs on a priority basis to the nucleation reaction, and therefore a new nucleus is hardly formed in the reaction solution, whereas nuclei grow to form composite hydroxide particles according to the present invention having a predetermined particle diameter.

After that, at the time when the composite hydroxide particles grow to have the predetermined particle diameter, the particle growth stage is completed. By finding a relationship between an amount of metal salt added to the reaction solution at the nucleation stage and the particle growth stage and the obtained particles from the preliminary test results, the particle diameter of the composite hydroxide particles can be easily determined.

Such a reaction solution, that is, a solution being obtained by mixing the mixed solution with the alkaline solution and the ammonia solution and being adjusted to have a pH of 10.5 to 12.0, is a claimed solution for particle growth.

As mentioned above, in the composite hydroxide particle production step, at the nucleation stage, the nucleation occurs on a priority basis whereas the nuclear growth hardly occurs, on the other hand, at the particle growth stage, only the nucleus growth occurs while a new nucleus is hardly formed.

Thus, at the nucleation stage, nuclei having a narrow particle size distribution and being homogeneous can be formed, on the other hand, at the particle growth stage, nuclei can be grown homogeneously. Therefore, in the composite hydroxide particle production step, composite hydroxide particles having a narrow particle size distribution and being homogeneous can be obtained.

Note that, in the above-mentioned production step, metal ions are crystallized out as nuclei or composite hydroxide particles at both the stages, whereby a ratio of a liquid component to a metal component in the reaction solution is increased. When this liquid component is increased, seemingly, a concentration of the mixed solution to be fed is decreased, and thus, there is a possibility that composite hydroxide particles are not sufficiently grow at the particle growth stage.

Therefore, in order to control an increase in the above-mentioned liquid component, a part of the liquid component in the reaction solution needs to be discharged out of the reaction vessel after completion of the nucleation stage or during the particle growth stage.

Specifically, the feeding of the mixed solution and the like into the reaction solution and stirring is stopped thereby to precipitate nuclei and composite hydroxide particles, and a supernatant liquid of the reaction solution is discharged.

Thus, a relative concentration of the mixed solution in the reaction solution can be made higher, and composite hydroxide particles can be grown in a state where a relative concentration of the mixed solution is high, whereby a particle-size distribution of the composite hydroxide particles can be further narrowed and a particle density of the composite hydroxide particles in the secondary particles can also be made higher.

Also, in the above-mentioned embodiment, the pH value of the solution for nucleation obtained after completion of the nucleation stage is adjusted to form the solution for the particle growth, and the particle growth is performed immediately after the nucleation stage, and therefore there is an advantage that shift to the particle growth stage can be performed quickly.

Furthermore, there are advantages that the shift from the nucleation stage to the particle growth stage can be performed only by adjustment of the pH of the reaction solution and this pH adjustment can be easily performed by temporarily stopping the feeding of the alkaline solution. Note that the pH of the reaction solution can be adjusted by adding inorganic acid which is the same kind of acid constituting the metal compound, for example, sulfuric acid in the case of sulfate, to a reaction solution.

Figure 2:
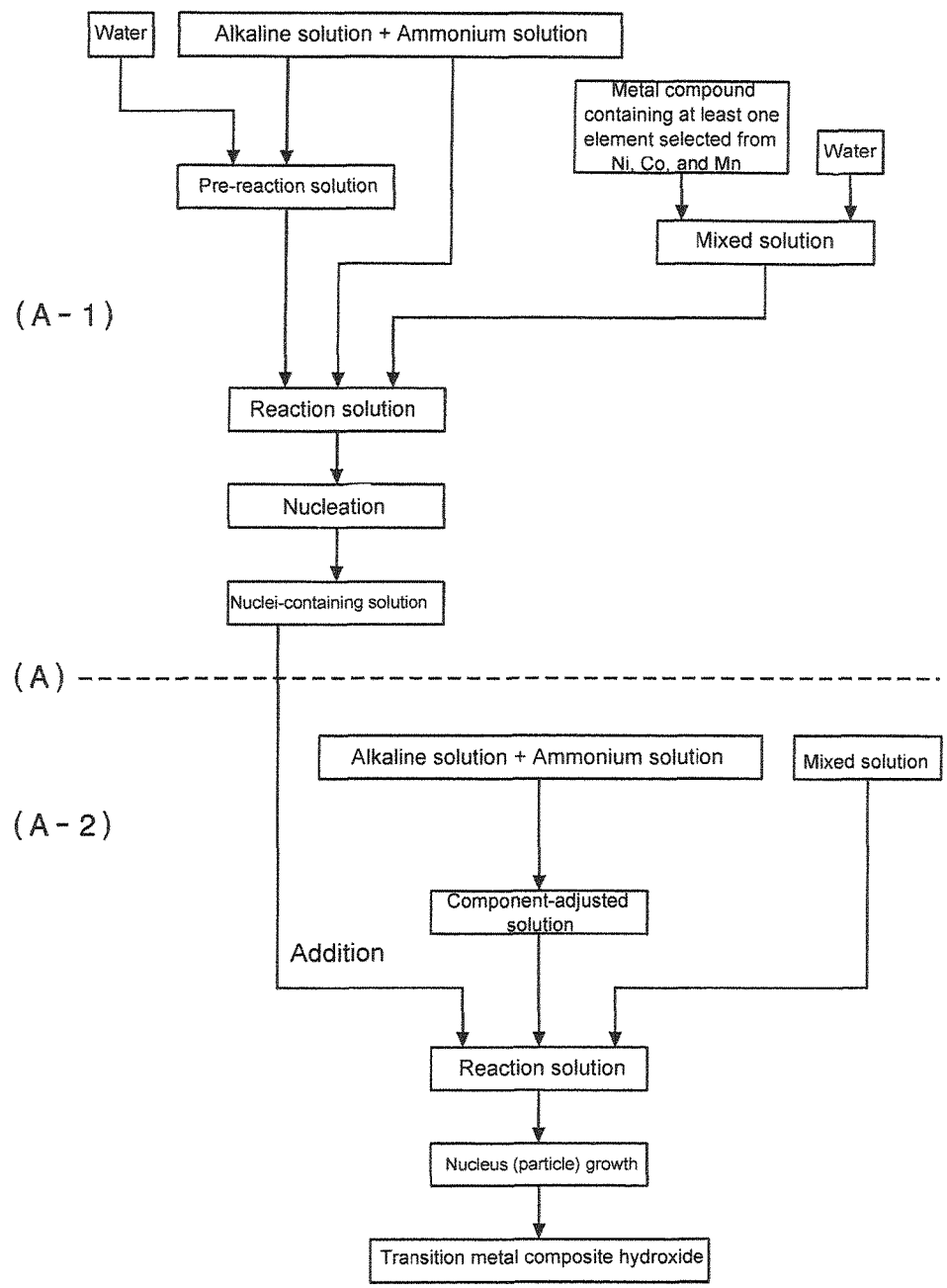
FIG. 2 is a schematic flow chart illustrating another process of producing a transition metal composite hydroxide according to the present invention.

Alternatively, as shown in FIG. 2, there may be another embodiment wherein, aside from a solution for nucleation, a component-adjusted solution adjusted to have a pH value and an ammonium ion concentration suitable for the nucleation stage is formed, and a solution containing nuclei formed in another reaction vessel by performing a nucleation process is added to this component-adjusted solution thereby to produce a reaction solution, and a particle growth process is performed for this reaction solution (that is, a solution for particle growth).

In this case, since the nucleation stage and the particle growth stage can be separated surely, a state of the reaction solution in each of the processes can be adjusted to be optimum for each of the processes. Particularly, the reaction solution can be adjusted to have an optimal pH condition from the initial stage of the particle growth stage. Therefore, the composite hydroxide particles formed at the particle growth stage can be made to have a narrower particle-size distribution and to be uniform.

Next, materials, solutions, and reaction conditions which are used at each of the stages will be explained in detail.

[pH Value]

(Nucleation Stage)

At the nucleation stage, the reaction solution is controlled so as to have a pH value of 12.0 to 14.0, preferably 12.5 to 13.0 at a reference solution temperature of 25 degrees C.

When a pH value is more than 14.0, produced nuclei are too minute, whereby a problem that the reaction solution is gelled arises. On the other hand, when the pH value is less than 12.0, a nucleus growth reaction occurs as well as a nucleation reaction, and thus formed nuclei have a wider particle-size distribution and are non-uniform.

Therefore, the reaction solution at the nucleation step needs to have a pH value of 12.0 to 14.0, and such pH value range makes it possible to control nucleus growth at the nucleation step, whereby almost only nucleation can be induced, and formed nuclei can be uniform and have a narrower particle-size distribution.

(Particle Growth Stage)

At the particle growth stage, the reaction solution is controlled so as to have a pH value of 10.5 to 12.0, preferably 11.0 to 12.0 at a reference solution temperature of 25 degrees C.

When the pH value is more than 12.0, too many nuclei are newly formed and accordingly hydroxide particles having a good particle size distribution cannot be obtained.

On the other hand, when the pH value is less than 10.5, solubility due to ammonia ions is high and more metal ions remain in the solution without precipitating, whereby production efficiency is worsened. Also, in the case where metal sulfate is used as a raw material, a more amount of S (sulfur) remains in the particles.

Therefore, the reaction solution at the particle growth step needs to have a pH value of 10.5 to 12.0, and such pH value makes it possible to induce only growth of nuclei formed at the nucleation on a priority basis and to control formation of a new nucleus, whereby composite hydroxide particles obtained can be uniform and have a narrower particle-size distribution.

At both the nucleation stage and the particle growth stage, it is preferable that a pH value fluctuation range is within plus and minus 0.2 of a predetermined value. When the pH value fluctuation range is wider, the nucleation and the particle growth are not stable and accordingly sometimes composite hydroxide particles having a narrow range of particle size distribution and being uniform cannot be obtained.

Note that, since the pH value of 12 is a boundary condition between the nucleation and the nucleus growth, depending on presence or non-presence of nuclei in the reaction solution, said pH value can be used as a condition for either the nucleation process or the particle growth process.

That is, in the case where a pH value at the nucleation stage is set to higher than 12 to form a large amount of nuclei and then, at the particle growth stage, the pH value is set to 12, a large amount of nuclei comes to be present in the reaction solution, and accordingly nucleus growth occurs on a priority basis, whereby hydroxide particles having a narrow particle-size distribution and a comparatively large particle diameter can be obtained.

On the other hand, in the case where no nucleus is present in the reaction solution, that is, a pH is set to 12 at the nucleation stage, no nucleus to grow is present, and accordingly nucleation occurs on a priority basis, and a pH value at the particle growth stage is set to less than 12, formed nuclei grow, whereby the above-mentioned hydroxide particles having a good quality can be obtained.

In each of the cases, a pH value at the particle growth stage just needs to be controlled to be lower than a pH at the nucleation stage.

[Formation Amount of Nucleus]

An amount of nuclei formed at the nucleation stage is not particularly limited, but, in order to obtain composite hydroxide particles having a good particle size distribution, preferably 0.1 to 2% of the whole amount, that is, all the metal salts supplied in order to obtain composite hydroxide particles, more preferably not more than 1.5%.

[Particle Diameter Control of Composite Hydroxide Particles]

A particle diameter of composite hydroxide according to the present invention hardly changes in the coating step, and therefore control of a particle diameter of the particles in the composite hydroxide particle production step allows a desired particle diameter to be obtained. The particle diameter of the above-mentioned composite hydroxide particles can be controlled using a time of the particle growth stage, and therefore, when the particle growth stage is continued until the composite hydroxide particles grow to have a desired particle diameter, the compound hydroxide particles having a desired particle diameter can be obtained.

Also, a particle diameter of the composite hydroxide particles can be controlled not only at the particle growth stage but also by a pH value at the nucleation stage and an amount of a raw material fed for the nucleation.

In other words, by setting a pH value in the nucleation at the high pH side or by making a nucleation time longer, an amount of a raw material to be fed is increased and the number of nuclei formed is increased. Thus, even when the particle growth step is performed under the same conditions, the composite hydroxide particles can be made to have a smaller particle diameter.

On the other hand, when the number of nuclei formed is controlled so as to be less, the composite hydroxide particles having a larger particle diameter can be obtained.

Hereinafter, conditions, such as a metal compound, an ammonia concentration in the reaction solution, a reaction temperature, an atmosphere, and the like will be explained. The difference in conditions between the nucleation stage and the particle growth stage is only a control range of a pH value of the reaction solution, and conditions, such as a metal compound, an ammonia concentration in the reaction solution, a reaction temperature, and an atmosphere are substantially the same at both the stages.

[Metal Compound]

A compound containing target metal is used as a metal compound.

A water-soluble compound is preferably used as the compound, and examples of said compound include nitrate, sulfate, and hydrochloride. For example, nickel sulfate, cobalt sulfate, or manganese sulfate is preferably used.

[Additive Element]

As an additive element (at least one additive element selected from transition metal elements other than M and W, group 2 elements, and group 13 elements), a water-soluble compound is preferably used. For example, aluminum sulfate, titanium sulfate, ammonium peroxotitanate, potassium titanium oxalate, vanadium sulfate, ammonium vanadate, chromium sulfate, potassium chromate, zirconium sulfate, zirconium nitrate, niobium oxalate, ammonium molybdate, or the like may be used.

To uniformly disperse said additive element inside the composite hydroxide particles, an additive containing the additive element just needs to be added to the mixed solution, whereby, in a state where the additive element is uniformly dispersed inside the composite hydroxide particles, coprecipitation thereof can be performed.

[Concentration of Mixed Solution]

The mixed solution preferably has a total metal compound concentration of 1 to 2.6 mol/L. In the case where the mixed solution has the concentration of less than 1 mol/L, an amount of precipitate per reaction vessel is smaller and thereby productivity is reduced, which is not preferable.

On the other hand, in the case where the mixed solution has a salt concentration of more than 2.6 mol/L, the concentration exceeds a saturated concentration of the solution when a liquid temperature falls, whereby a crystal re-precipitates and thereby causes a risk, such as blocking of equipment piping.

The metal compound may not be necessarily fed into a reaction vessel in a form of a mixed solution, and for example, in the case where a metal compound which reacts to form a compound when mixed is used, metal compound solutions may be individually prepared so as to have a total concentration of all the metal compound solutions within the above-mentioned concentration range, and simultaneously fed into a reaction vessel at a predetermined ratio as individual metal compound solutions.

Furthermore, it is preferable that the mixed solution and the like and each metal compound solution are fed into a reaction vessel in the amounts in which a concentration of a crystallized product is approximately 30 to 200 g/L at the time of completion of crystallization reaction. This is because when a concentration of the crystallized product is less than 30 g/L, aggregation of primary particles is sometimes insufficient, on the other hand, when a concentration of the crystallized product is more than 200 g/L, the mixed solution added insufficiently diffuses into the reaction vessel and accordingly an imbalance in particle growth is sometimes caused.

[Ammonia Concentration]

A concentration of ammonia in the reaction solution is preferably maintained at a fixed value within a range of 3 to 25 g/L.

Ammonia acts as a complexing agent, and therefore, when a concentration of ammonia is less than 3 g/L, the solubility of metal ions cannot be maintained constant, plate-like hydroxide primary particles which are uniform in shape and particle diameter are not formed, and gel-like nuclei are easily formed, whereby a particle size distribution is easily made wider.

On the other hand, the ammonia concentration of more than 25 g/L causes too high solubility of metal ions and an increase in amount of metal ions remaining in the reaction solution, whereby deviation in composition is caused. Moreover, crystallinity of the particles becomes high, whereby a specific surface area is sometimes too small.

Furthermore, when the ammonia concentration varies, the solubility of metal ions varies and uniform hydroxide particles are not formed, and therefore the ammonia concentration is preferably maintained at a fixed value. For example, the ammonia concentration is preferably maintained at a desired concentration in a range between upper and lower limits of approximately 5 g/L.

Note that an ammonium ion supply source is not particularly limited, but, for example, ammonia, ammonium sulfate, ammonium chloride, ammonium carbonate, ammonium fluoride, or the like may be used.

[Reaction Atmosphere]

At the nucleation stage, in view of controlling oxidation of transition metal, particularly cobalt and manganese, to stably form particles, a concentration of oxygen in a space inside the reaction vessel is preferably controlled to not more than 10% by volume, more preferably not more than 5% by volume, and also it is preferable that, with a concentration of oxygen dissolved in a solution in the reaction vessel being controlled to not more than 2 mg/L, a crystallization reaction is performed. This manner allows unnecessary oxidation of particles to be controlled and allows particles having a high density and a controlled specific surface area and being uniform in particle size to be obtained.

On the other hand, oxidation control is important also at the particle growth stage, and a concentration of oxygen in the space in the reaction vessel is preferably controlled in the same manner.

A concentration of oxygen in the atmosphere can be adjusted, for example, using inert gas, such as nitrogen.

Examples of means to adjust a concentration of oxygen in the atmosphere to a predetermined concentration include continuous circulation of inert gas, such as nitrogen, through the atmosphere in the space inside the reaction vessel.

[Reaction Solution Temperature]

In the reaction vessel, a temperature of the reaction solution is preferably set to not less than 20 degrees C., more preferably 20 to 60 degrees C., further more preferably 35 to 60 degrees C.

When a temperature of the reaction solution is less than 20 degrees C., solubility is low and therefore nuclei are easily formed and nuclei formation is hard to be controlled. Moreover, the primary particles constituting composite hydroxide particles are made finer, thereby sometimes causing a too large specific surface area. On the other hand, a temperature of the reaction solution is more than 60 degrees C., ammonia used for complex formation runs short due to volatilization of ammonia, and, as is the case with a temperature of less than 20 degrees C., solubility of metal ions easily decreases.

[Alkaline Solution]

The alkaline solution to adjust a pH value in the reaction solution is not particularly limited, and, for example, an alkali metal hydroxide solution, such as sodium hydroxide or potassium hydroxide, may be used. Said alkali metal hydroxide may be fed into the reaction solution as it is, but preferably added to the reaction solution in the reaction vessel in a form of solution because this makes it easier to control a pH value of the reaction solution in the reaction vessel.

Moreover, a way of adding the alkaline solution to the reaction vessel is not particularly limited, and it is simply necessary that, with the mixed solution sufficiently being stirred, the alkaline solution is added such by a pump capable of controlling a flow rate, such as a metering pump, so as to maintain a pH value of the reaction solution in a predetermined range.

[Production Equipment]

In the above-mentioned composite hydroxide production step, there is used an apparatus having a system not to collect a product until a reaction is completed. Examples of the apparatus include a batch reaction vessel which is commonly used and in which a stirrer is installed.

When such apparatus is adopted, unlike a common continuous crystallizer which collects a product by overflow, a problem that particles under growth are collected simultaneously together with an overflow liquid does not arise, and therefore particles having a narrow particle-size distribution and being uniform in particle diameter can be obtained.

Also, in order to control a reaction atmosphere, an apparatus capable of controlling an atmosphere, such as a hermetically-sealed type apparatus, is preferably used.

The use of such apparatus allows the nucleation reaction and the particle growth reaction to proceed almost uniformly, whereby particles having an excellent particle-size distribution (that is, particles having a narrow particle-size distribution range) can be obtained.

After completion of the particle growth stage, washing is performed to remove Na salts adhered to particles, whereby composite hydroxide particles are obtained.

(B) Coating Step

In the coating step, the composite hydroxide particles obtained at the above-mentioned particle production step are mixed with a solution containing at least a tungsten compound and slurried, and the slurry is controlled to have a pH of 7 to 9 at a reference solution temperature of 25 degrees C., whereby a coating material containing a metal oxide of tungsten and the additive element or a metal hydroxide of tungsten and the additive element is formed on the surfaces of said composite hydroxide particles.

First, the above-mentioned composite hydroxide particles are slurred. The slurrying may be performed in such a manner that the composite hydroxide particles are mixed with a solution prepared in advance and containing a coating element, or after mixing of the composite hydroxide particles with water, a compound containing a coating element is added thereto.

A concentration of the composite hydroxide particles in the above-mentioned slurry is preferably 100 to 300 g/L. A slurry concentration of less than 100 g/L leads to too much liquid to be treated, whereby productivity is reduced, which is not preferable. On the other hand, a slurry concentration of more than 300 g/L sometimes causes the composite hydroxide particles not to be coated uniformly with a coating material. Almost the whole amount of tungsten ions and additive element ions which are dissolved in the slurry are precipitated as oxides or hydroxides on the surfaces of the composite hydroxide particles.

Therefore, a tungsten compound and a compound containing the additive element to be added to the slurry are made to have a ratio of the number of atoms shown in the above-mentioned general formula (1). Note that, in the case where the additive element is added to the above-mentioned mixed solution, the additive element is added to the slurry in the amounts which are smaller by an amount of the additive element added to the mixed solution, whereby a ratio of the number of atoms of metal ions in the composite hydroxide particles to be obtained can be made in agreement with the ratio of the number of atoms shown in the general formula (1).

After preparation of the slurry, the composite hydroxide particles and the dissolved tungsten ions and the dissolved additive element ions are stirred so as to be uniformly mixed, and then acid, such as sulfuric acid, is added so that a pH value is adjusted to 7 to 9, preferably 8 to 9 at a reference solution temperature of 25 degrees C.

Although a pH range of not more than 7 allows precipitation of tungsten, a too low pH value causes a problem that hydroxide dissolves, and also, an amount of sulfuric acid used is increased, thereby causing an increase in cost. On the other hand, a pH value of more than 9 causes insufficient precipitation of a tungsten oxide hydrate on the surfaces of the composite hydroxide particles.

In order to further improve thermal stability of a positive electrode active material, aluminum is preferably used to be added as an additive element. Addition of an aluminum compound into the slurry to perform crystallization of tungsten and aluminum simultaneously allows the above-mentioned coating material to made into a mixture containing a tungsten oxide hydrate and an aluminum hydroxide.

The tungsten compound to be used is not particularly limited as long as being stable in a form of a solution, but ammonium tungstate and/or sodium tungstate, which can be easily industrially handled, are preferably used.

Ammonium tungstate has a low solubility in water, that is, approximately 30 g/L, but, once dissolved, it is not precipitated even if a pH is lowered to approximately 1. Also, even if ammonia is added in order to lower the solubility, the precipitation is difficult in an alkaline area. However, when sulfuric acid is added in the presence of ammonia, adjustment of a pH value to 7 to 9 induces the precipitation, and furthermore, the coexistence of the composite hydroxide particles to serve as nuclei allows precipitation on surfaces of the composite hydroxide particles, uniform crystallization of the coating material, and formation of a coating layer.

In the case of using ammonium tungstate, ammonia contained in a 25% ammonia solution in an amount equivalent to 0.5 to 25% by volume of an ammonium tungstate saturated solution is preferably added to the slurry. If an amount of ammonia added is small, the tungsten oxide hydrate is decomposed by sulfuric acid, whereby the precipitation thereof is prevented. On the other hand, if an amount of ammonia added is too large, sulfuric acid is only wasted for pH value adjustment, which is uneconomical. Preferably, ammonia contained in a 25% ammonia solution in an amount equivalent to 1 to 10% by volume of an ammonium tungstate saturated solution is added, and then a pH value is adjusted to 7 to 9, whereby a composite hydroxide efficiently coated with a tungsten oxide hydrate on the surfaces of the composite hydroxide particles is obtained.

On the other hand, since sodium tungstate has a high solubility in water, that is, approximately not less than 100 g/L, sodium tungstate is not precipitated by simple pH adjustment, but the presence of the composite hydroxide particles which can serve as nuclei even without no addition of ammonia allows sodium tungstate to be precipitated on the surfaces of the particles and to made to more uniformly coat the surfaces in the coexistence of aluminum.

An aluminum compound to be used is not particularly limited, but there is preferably used sodium aluminate, which makes it possible to precipitate aluminum hydroxide by adjusting a pH value with addition of sulfuric acid. Thus, pH is controlled by addition of sulfuric acid to the slurry so that tungsten and aluminum are simultaneously precipitated as compounds, whereby the surfaces of the composite hydroxide particles can be uniformly coated with a mixture containing tungsten oxide hydrate and aluminum hydroxide.

This coating step makes it possible to form a very fine and uniform coating material on the surfaces of the composite hydroxide particles, and therefore an increase in specific surface area of the composite hydroxide can be controlled. Also, this coating step allows almost the whole amount of tungsten in the slurry to be precipitated on the surfaces of the composite hydroxide particles, and accordingly an amount of tungsten contained in the composite hydroxide is stabilized, and variation in amount of tungsten between particles can be also controlled.

2-1. Positive Electrode Active Material for Nonaqueous Electrolyte Secondary Batteries A positive electrode active material for nonaqueous electrolyte secondary batteries according to the present invention (hereinafter referred to as a positive electrode active material according to the present invention) is suitable as a material for positive electrodes of nonaqueous electrolyte secondary batteries.

The positive electrode active material according to the present invention is a positive electrode active material including a lithium transition metal composite oxide represented by the following general formula (2) and having a layered hexagonal crystal structure, wherein the positive electrode active material has an average particle diameter of 3 to 8 μm and an index indicating a scale of particle-size distribution, $[(d_{90}-d_{10})/\text{average-particle-diameter}]$, of not more than 0.60.

[Chemical Formula 4]

$$Li_{1+u}M_xW_sA_tO_2 \quad (2)$$

wherein,

−0.05≤u≤0.50, x+s+t=1, 0<s≤0.05, 0<s+t≤0.15,

M is at least one transition metal selected from Ni, Co and Mn, and

A is at least one additive element selected from transition metal elements other than M and W, group 2 elements, and group 13 elements.

[Particle Size Distribution]

The positive electrode active material according to the present invention has an index indicating a scale of particle-size distribution, [(d90−d10)/average-particle-diameter], of not more than 0.6.

When a particle size distribution is wide-ranging, many fine particles whose particle diameter is considerably small with respect to an average particle diameter and many particles (coarse particles) whose particle diameter is considerably large with respect to the average particle diameter are present in the positive electrode active material.

In the case where a positive electrode is formed using the positive electrode active material including the many fine particles, a local reaction of the fine particles may cause heat generation, and accordingly safety is lowered and also the fine particles are selectively degraded, whereby cycle characteristics are worsened. On the other hand, in the case where a positive electrode is formed using the positive electrode active material including the many coarse particles, a reaction area of an electrolyte solution with the positive electrode active material cannot be sufficiently secured, and accordingly an increase in reaction resistance causes a decrease in battery output.

Therefore, when the positive electrode active material is made to have a particle-size distribution index, [(d90−d10)/average-particle-diameter], of not more than 0.6, a proportion of fine particles and coarse particles is smaller and therefore a battery using this positive electrode active material for a positive electrode is excellent in safety and has good cycle characteristics and high battery-output.

Note that an average particle diameter (d50), and d10 and d90 each represent the same as those represented in the case of the above-mentioned transition metal composite hydroxide, and can be calculated in the same manner.

[Average Particle Diameter]

The positive electrode active material according to the present invention has an average particle diameter of 3 to 8 μm. In the case where an average particle diameter is less than 3 μm, the filling density of particles is lowered when a positive electrode is formed, whereby a battery capacity per volume of the positive electrode is reduced. On the other hand, in the case where an average particle diameter is more than 8 μm, a specific surface area of the positive electrode active material is decreased to reduce an interface with an electrolyte solution of a battery, whereby resistance of a positive electrode is increased to reduce output characteristics of the battery.

Therefore, when the positive electrode active material according to the present invention is adjusted to have an average particle diameter of 3 to 8 μm, preferably 3 to 6 μm, a battery using this positive electrode active material for a positive electrode can have a larger battery-capacity per volume and also have excellent battery characteristics, such as high safety and high output.

[Specific Surface Area]

The positive electrode active material according to the present invention preferably has a specific surface area of 0.5 to 2.0 m2/g. When a specific surface area is less than 0.5 m2/g, the positive electrode active material has a smaller contact area with an electrolyte solution, thereby causing a reaction surface area to be smaller and a positive electrode resistance to be increased, whereby output characteristics of a battery are sometimes lowered. On the other hand, when a specific surface area is more than 2.0 $m^2/g$, the positive electrode active material excessively contacts with an electrolyte solution, whereby thermal stability is sometimes lowered. In the present invention, the composite hydroxide having a controlled specific surface area is used as a precursor, and therefore a specific surface area of the positive electrode active material is also stably controlled in the above-mentioned range.

[Composition of Particles]

The positive electrode active material according to the present invention has a composition represented by the above-mentioned general formula (2), wherein a range of u, which represents an excessive amount of lithium, is −0.05≤u≤0.50. When the excessive amount of lithium, u, is less than −0.05, a positive electrode in a nonaqueous electrolyte secondary battery using the obtained positive electrode active material has a higher reaction resistance, and therefore battery output is reduced. On the other hand, when the excessive amount of lithium, u, is more than 0.50, an initial discharge capacity in the case of using the above-mentioned positive electrode active material for a positive electrode of a battery is decreased and also a reaction resistance of the positive electrode is increased.

Also, as represented by the general formula (2), in the positive electrode active material according to the present invention, tungsten is contained in a lithium transition metal composite oxide.

By making tungsten contained therein, positive electrode resistance can be reduced and output characteristics of a battery using the lithium transition metal composite oxide as a positive electrode active material can be improved. When an amount of tungsten added exceeds an amount at a ratio of tungsten with respect to all the metal elements other than lithium of 0.05, battery capacity falls.

The additive element used for a positive electrode active material in order to improve durable characteristics and output characteristics of a battery is preferably at least one element selected from B, Al, Sc, Y, Ti, Zr, Hf, V, Nb, Ta, Cr, and Mo, more preferably at least Al. Addition of Al allows thermal stability of the positive electrode active material to be improved.

When an atomic ratio, s+t, of tungsten and an additive element A with respect to all the metal elements other than lithium exceeds 0.15, metal elements contributing to a redox reaction are decreased, whereby battery capacity falls. On the other hand, when s+t is not more than 0.02, improvement effects for output characteristics and thermal stability of a battery are sometimes insufficient.

Therefore, the above-mentioned atomic ratio is preferably 0.02<s+t≤0.15.

Particularly, when tungsten and the additive element are uniformly distributed on the surfaces or the inside of the particles, the above-mentioned effects can be achieved in the whole particles, whereby only a small amount of addition thereof allows said effects to be obtained and an decrease in battery capacity to be controlled.

The positive electrode active material according to the present invention is preferably such that M in the above-mentioned general formula (2) contains at least Ni and Co, specifically, the positive electrode active material is preferably a composite oxide represented by the following general formula (2-1).

[Chemical Formula 5]

$$Li_{1+u}Ni_{1-x-s-t}Co_xW_sA_tO_2 \quad (2\text{-}1)$$

wherein,
−0.05≤u≤0.15, 0≤x≤0.2, 0<s≤0.05, 0<t≤0.15, x+s+t<0.3, and

A is at least one additive element selected from transition metal elements other than Ni, Co, and W, group 2 elements, and group 13 elements.

The composition in the above-mentioned general formula (2-1) aims at achieving a battery having higher-capacity, and an amount of excessive lithium, u, is preferably −0.05≤u≤0.15 so that a battery can have both high capacity and high output. Also, from viewpoints of battery capacity and thermal stability, a range of x representing the above-mentioned atomic ratio of Co is preferably 0≤x≤0.2.

Moreover, as another aspect, M preferably contains at least Ni and Mn, specifically, is preferably a composite oxide represented by the following general formula (2-2).

[Chemical Formula 6]

$$Li_{1+u}Ni_xMn_yCo_zW_sA_tO_2 \quad (2\text{-}2)$$

wherein,
−0.05≤u≤0.50, x+y+z+s+t=1, 0.3≤x≤0.7, 0.1≤y≤0.55, 0≤z≤0.4, 0<s≤0.05, 0<t≤0.15, and A is at least one additive element selected from transition metal elements other than Ni, Co, Mn, and W, group 2 elements, and group 13 elements.

In the case of the composition in the above-mentioned general formula (2-2), an amount of excessive lithium u is preferably −0.05≤u≤0.15 in order to further reduce reaction resistance.

A range of x representing an atomic ratio of Ni is preferably 0.3≤x≤0.7.

Also, a range of y representing an atomic ratio of Mn is preferably 0.1≤y≤0.55 so that a battery can have both high capacity and high output.

From viewpoints of battery capacity and thermal stability, a range of z representing an atomic ratio of Co is preferably 0≤z≤0.4.

2-2. Method for Producing Positive Electrode Active Material for Nonaqueous Electrolyte Secondary Batteries A method for producing the positive electrode active material according to the present invention is not particularly limited as long as the positive electrode active material can be produced so as to have the above-mentioned average particle diameter, the particle size distribution, the specific surface area, and the composition, but the following method is preferably applied because the above-mentioned positive electrode active material can be more surely produced.

Figure 3:
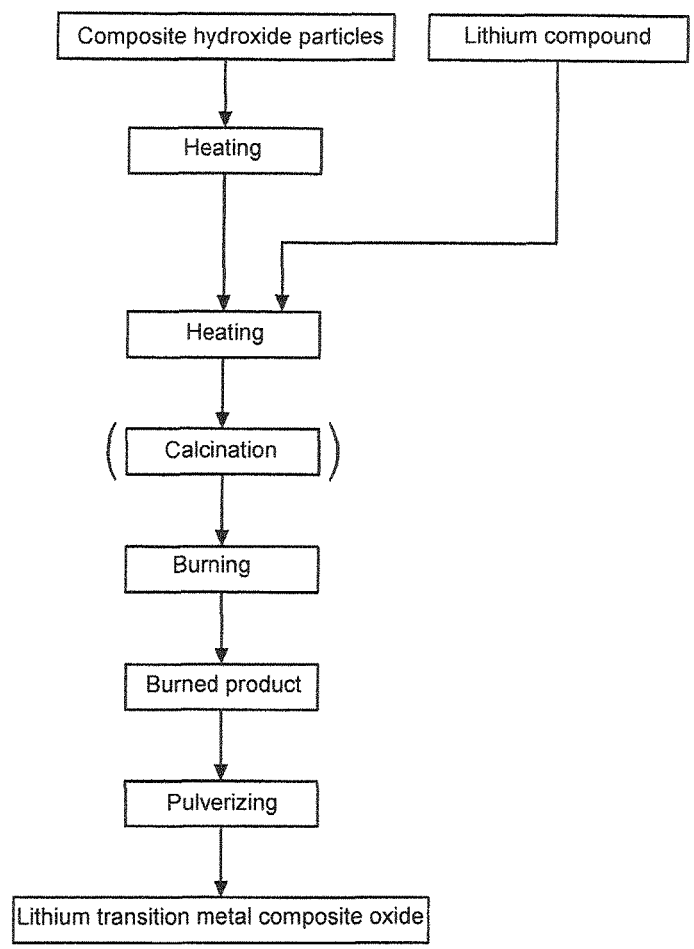
FIG. 3 is a schematic flow chart illustrating a process of producing a lithium transition metal composite oxide from a transition metal composite hydroxide according to the present invention.

The method for producing the positive electrode active material according to the present invention comprises the following three steps, as shown in FIG. 3.

(a) Heat treatment step of heat-treating a transition metal composite hydroxide which serves as a raw material of the positive electrode active material according to the present invention.

(b) Mixing step of mixing a lithium compound with the composite hydroxide after the heat treatment to form a lithium mixture.

(c) burning step of burning the lithium mixture formed in the mixing step.

Hereinafter, each of the steps will be explained.

(a) Heat Treatment Step

The heat treatment step is a step wherein a transition metal composite hydroxide (hereinafter simply referred to as a composite hydroxide) is heat-treated to remove moisture contained in the composite hydroxide, and a temperature of the heat treatment is preferably 500 to 750 degrees C.

Particularly, the heat treatment of heating the composite hydroxide to the above-mentioned temperature allows moisture to be removed and also the composite hydroxide to be converted into a transition metal composite oxide (hereinafter, simply referred to as a composite oxide), and therefore ratios of the number of atoms of metals and of the number of atoms of lithium in the positive electrode active material obtained can be prevented from varying. Note that, with performing a treatment, such as implementation of an accurate analysis before the burning step or implementation of analysis and correction after the mixing, the heat treatment step may be skipped, or with mainly aiming at removal of contained moisture, heat-treatment may be performed at a temperature of not less than 105 degrees C. and less than 500 degrees C.

In the case of a heating temperature of less than 500 degrees C. in the heat treatment step, a composite hydroxide is sometimes insufficiently converted into a composite oxide, on the other hand, in the case of a heating temperature of more than 750 degrees C., particles are sintered, whereby a composite oxide having a uniform particle diameter is not sometimes obtained.

An atmosphere for the heat treatment is not particularly limited and a non-reducing atmosphere is good enough, but the heat treatment is preferably performed in air flow because the treatment can be easily performed.

Furthermore, a heat treatment time is not particularly limited, but a heat treatment time of less than 1 hour sometimes causes insufficient conversion of a composite hydroxide into compound oxide particles, and therefore a heat treatment time is preferably at least 1 hour or more, more preferably 5 to 15 hours.

Also, equipment to be used for this heat treatment is not particularly limited, and equipment capable of heating the composite hydroxide in a non-reducing atmosphere, preferably in air flow, is good enough, and an electric furnace without generation of gas may be suitably used.

(b) Mixing Step

The mixing step is a step of mixing the composite hydroxide obtained after the above-mentioned heat treatment with a material containing lithium, for example, a lithium compound, thereby obtaining a lithium mixture. The composite hydroxide obtained after the heat treatment in the mixing step includes a composite hydroxide obtained with skipping the heat treatment step, a composite hydroxide obtained after removal of residual water in the heat treatment step, and a composite oxide obtained by the conversion in the heat treatment step.

The composite hydroxide obtained after the heat treatment and a material containing lithium are mixed so that a ratio (Li/Me) of the number of lithium atoms (Li) to the total number of atoms of all the metal elements other than lithium (that is, the total number of atoms of M, W, and an additive element, (Me)) in the lithium mixture is 1:0.95 to 1:1.50.

In other words, Li/Me hardly changes between before and after the burning step and Li/Me in the mixing step is to be Li/Me in the positive electrode active material, and therefore the mixing is performed so that Li/Me in the lithium mixture is to be the same as Li/Me in the positive electrode active material to be obtained.

The material containing lithium used for forming the lithium mixture is not particularly limited and a lithium compound is good enough. For example, lithium hydroxide, lithium nitrate, and lithium carbonate, and a mixture thereof are preferable because of the easy availability.

Note that the lithium mixture is preferably sufficiently mixed before the burning. When the mixing is insufficient, individual particles have different Li/Me, whereby a problem that sufficient battery characteristics are not achieved or the like may arise.

In the mixing, an ordinary mixer, such as a shaker mixer, a Lodige mixer, a Julia mixer, or a V blender, may be used, and the composite oxide particles are sufficiently mixed with the material containing lithium so that forms of the composite oxide particles and the like are not broken.

(c) Burning Step

The burning step is a step of burning the lithium mixture obtained by the above-mentioned mixing step to form a lithium transition metal composite oxide. When the lithium mixture is burned in the burning step, lithium in the material containing lithium is diffused into the compound oxide particles, whereby a lithium transition metal composite oxide is formed.

[Burning Temperature]

The lithium mixture is burned at a temperature of 700 to 1000 degrees C.

When a burning temperature is less than 700 degrees C., lithium is not sufficiently diffused into the compound oxide particles, whereby excessive lithium and unreacted particles remain and a crystal structure is not sufficiently well-balanced, and consequently a problem that sufficient battery characteristics are not obtained arises.

Also, when a burning temperature is more than 1000 degrees C., intense sintering between the compound oxide particles and also abnormal particle growth may be caused, whereby there is a possibility that particles after burning become coarse and the particle form (the form of sphere-shaped secondary particles mentioned) cannot be maintained.

Such positive electrode active material has a smaller specific surface area and therefore when the positive electrode active material is used for a battery, a problem that positive electrode resistance is increased and battery capacity is reduced arises.

Therefore, when the above-mentioned atomic ratio of Ni is not less than 0.7, the lithium mixture is preferably burned at 700 to 800 degrees C. Also, when the above-mentioned atomic ratio of Mn is not less than 0.3, the lithium mixture is preferably burned at 800 to 1000 degrees C.

[Burning Time]

A burning time is preferably not less than 3 hours, more preferably 6 to 24 hours. A burning time of less than 3 hours sometimes causes insufficient formation of a lithium transition metal composite oxide.

[Calcination]

Particularly, in the case where lithium hydroxide, lithium carbonate, or the like is used as a material containing lithium, calcination is preferably performed before the burning with a temperature lower than the burning temperature and of 350 to 800 degrees C. for approximately 1 to 10 hours.

In other words, calcination is preferably performed at a temperature of reacting lithium hydroxide or lithium carbonate to the composite hydroxide obtained after the heat treatment. When a temperature is maintained around the above-mentioned reaction temperature of lithium hydroxide or lithium carbonate, lithium is sufficiently diffused into the composite hydroxide obtained after the heat treatment, whereby a uniform lithium transition metal composite oxide can be obtained.

[Burning Atmosphere]

The atmosphere for the burning is preferably an oxidizing atmosphere, more preferably an atmosphere having an oxygen concentration of 18 to 100% by volume, still more preferably a mixed atmosphere of oxygen and inert gas.

In other words, the burning is preferably performed in the air or an oxygen current. There is a possibility that an oxygen concentration of less than 18% by volume causes insufficient crystallinity of the lithium transition metal composite hydroxide. Particularly, in consideration of battery characteristics, it is preferable to perform the burning in an oxygen current.

Note that a furnace used for the burning is not particularly limited and a furnace capable of heating the lithium mixture in the air or an oxygen current is good enough, but an electric furnace without gas generation is preferably used, and any of a batch type furnace and a continuous type furnace may be used.

[Pulverizing]

Aggregation or slight sintering of the lithium transition metal composite oxide obtained by the burning is sometimes caused, and in this case, the lithium transition metal composite oxide may be pulverized, whereby the positive electrode active material according to the present invention can be obtained.

Note that pulverizing means an operation being such that mechanical energy is supplied to an aggregation resulting from sintering necking or the like between secondary particles at the time of the burning and composed of a plurality of secondary particles, whereby the secondary particles are separated almost without destroying the secondary particles and the aggregation is loosened.

3. Nonaqueous Electrolyte Secondary Battery

Figure 4:
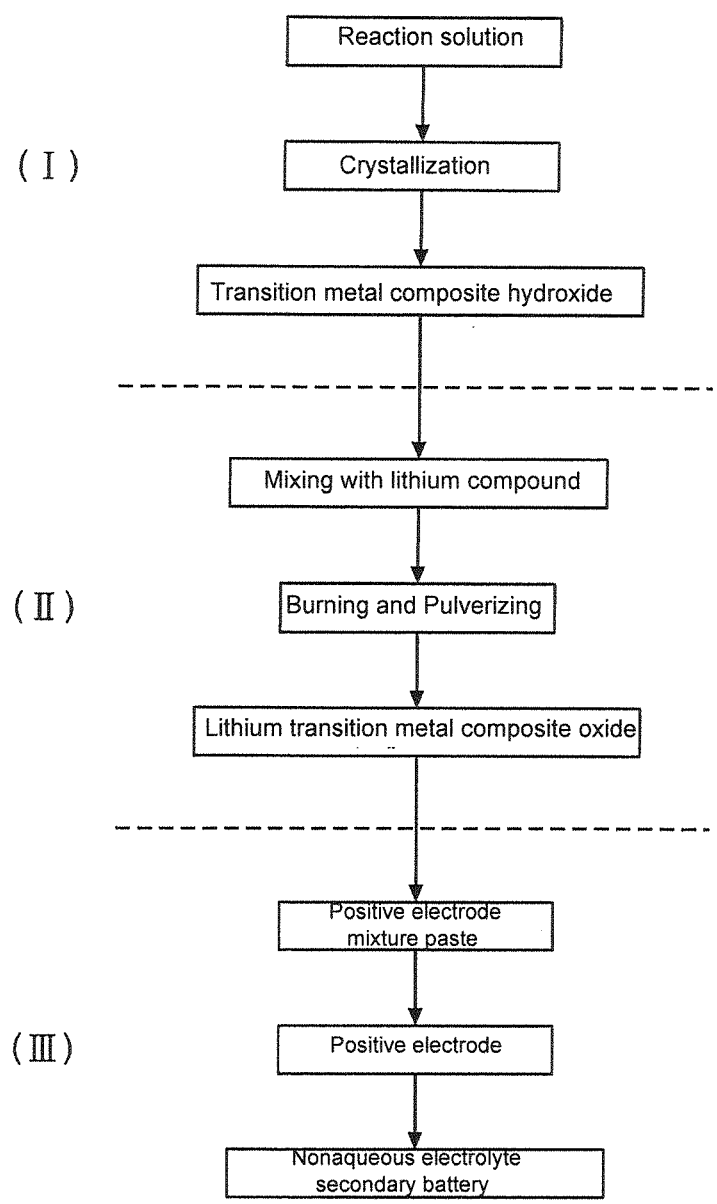
FIG. 4 is a schematic flow chart illustrating a flow from producing a transition metal composite hydroxide to producing a nonaqueous electrolyte secondary battery according to the present invention.

A nonaqueous electrolyte secondary battery according to the present invention is a battery adopting a positive electrode using the positive electrode active material for nonaqueous electrolyte secondary batteries in accordance with a production flow chart illustrated in FIG. 4, the positive electrode active material comprising a lithium transition metal composite oxide which uses a transition metal composite hydroxide according to the present invention as a precursor.

First, a structure of the nonaqueous electrolyte secondary battery according to the present invention will be explained.

The nonaqueous electrolyte secondary battery according to the present invention (hereinafter sometimes simply referred to as a secondary battery according to the present invention) has a structure substantially equivalent to an ordinary nonaqueous electrolyte secondary battery, except that the positive electrode active material according to the present invention is used as a material of a positive electrode.

Specifically, the secondary battery according to the present invention has a structure comprising a case, and a positive electrode, a negative electrode, a nonaqueous electrolyte solution, and a separator, each being enclosed in said case.

More specifically, the secondary battery according to the present invention is formed in such a manner that the positive electrode and the negative electrode are laminated via the separator to form an electrode body; the obtained electrode body is impregnated with the nonaqueous electrolyte solution; connection between a positive electrode current collector and a positive electrode terminal connected with an exterior and connection between a negative electrode current collector and a negative electrode terminal connected with an exterior each are established using such as a lead for current collecting; and sealing in the case is performed. As a shape of the secondary battery according to the present invention, various shapes, such as a cylinder type and a laminated type, may be applied.

Note that a structure of the secondary battery according to the present invention is, needless to say, not limited to the above-mentioned example, and can be realized in a form in which various changes and improvements are made based on the knowledge of a person skilled in the art. Furthermore, use of the nonaqueous electrolyte secondary battery according to the present invention is not particularly limited.

Hereinafter, each part constituting the secondary battery according to the present invention will be explained.

(1) Positive Electrode

First, the positive electrode characterizing the secondary battery according to the present invention will be explained.

A positive electrode is a sheet-like member and formed by, for example, applying a positive electrode mixture paste containing the positive electrode active material according to the present invention to a surface of the collector made of aluminum foil and then drying it.

Note that the positive electrode is processed to be suitable for a battery to be used. For example, a cutting treatment to cut the positive electrode into a size suitable for an objective battery, pressurization and compression treatment by a roll press or the like in order to increase electrode density, or the like is performed.

[Positive Electrode Mixture Paste]

The positive electrode mixture paste to be used is formed by adding a solvent to a positive electrode mixture and kneading it.

The positive electrode mixture is formed by mixing the positive electrode active material according to the present invention in powder form, an electric conductive material, and a binding agent.

The electric conductive material is added in order to provide suitable conductivity to the electrode. This electric conductive material is not particularly limited, but examples of the electric conductive material include graphite (natural graphite, artificial graphite, expanded graphite, and the like) and a carbon black material, such as acetylene black and Ketchen black.

The binding agent plays a role which ties positive electrode active material particles.

The binding agent to be used for the positive electrode mixture is not particularly limited, but examples of the binding agent include polyvinylidene fluoride (PVDF), polytetrafluoroethylene (PTFE), fluororubber, ethylene propylene diene rubber, styrene butadiene, cellulose resin, and polyacrylic acid.

Note that activated carbon or the like may be added to the positive electrode mixture. The addition of activated carbon or the like allows electrical double-layer capacity to be increased.

The solvent plays a role in dissolving the binding agent to disperse the positive electrode active material, the electric conductive material, the activated carbon, and the like into the binding agent. This solvent is not particularly limited, but examples of the solvent include an organic solvent, such as N-methyl-2-pyrrolidone.

A mixing ratio of each component in the positive electrode mixture paste is not particularly limited. For example, when a solid content in the positive electrode mixture except the solvent is taken as 100 parts by mass, as is the case with a positive electrode of an ordinary nonaqueous electrolyte secondary battery, a content of the positive electrode active material may be 60 to 95 parts by mass, a content of the electric conductive material may be 1 to 20 parts by mass, and a content of the binding agent may be 1 to 20 parts by mass.

(2) Negative Electrode

The negative electrode is a sheet-like member formed by applying a negative electrode mixture paste to a surface of a metallic foil current collector, such as copper, and then drying it. This negative electrode is different from the above-mentioned positive electrode in component constituting the negative electrode mixture paste, formulation, current collector material, and the like, but is formed in substantially the same manner as the positive electrode, and as is the case with the positive electrode, each of the treatments is performed as needed.

The negative electrode mixture paste is formed in such a manner that a negative electrode active material is mixed with a binding agent to form a negative electrode mixture and an appropriate solvent is added thereto, thereby making the negative electrode mixture into a paste form.

As the negative electrode active material, there may be adopted, for example, a material containing lithium, such as metallic lithium or a lithium alloy, or a inclusion material capable of inclusion and desorption of lithium ions.

The inclusion material is not particularly limited, but examples of the inclusion material include an organic compound burned material, such as natural graphite, artificial graphite, and phenol resin, and powder of a carbon substance, such as coke.

In the case where said inclusion material is adopted as a negative electrode active material, as is the case with the positive electrode, a fluorine-containing resin, such as PVDF, is usable as the binding agent, and as the solvent to disperse the negative electrode active material into the binding agent, an organic solvent, such as N-methyl-2-pyrrolidone, is usable.

(3) Separator

A separator is arranged so as to be sandwiched between the positive electrode and the negative electrode, and has a function to separate the positive electrode and the negative electrode and maintain an electrolyte. As said separator, for example, a thin film made of polyethylene, polypropylene, or the like and having many minute pores may be used, but a material is not particularly limited as long as it has the above-mentioned function.

(4) Nonaqueous Electrolyte Solution

A nonaqueous electrolyte solution is obtained by dissolving lithium salt as a supporting electrolyte in an organic solvent.

As the organic solvent, there may be used one kind alone or two or more kinds mixed, selected from the group consisting of a cyclic carbonate, such as ethylene carbonate, propylene carbonate, butylene carbonate, or trifluoro propylene carbonate; a chain carbonate, such as diethyl carbonate, dimethyl carbonate, ethylmethyl carbonate, or dipropyl carbonate; an ether compound, such as tetrahydrofuran, 2-methyltetrahydrofuran, or dimethoxyethane; a sulfur compound, such as ethylmethylsulfone or butanesultone; a phosphorus compound, such as triethyl phosphate or trioctyl phosphate; and the like.

As the supporting electrolyte, LiPF6, LiBF4, LiClO4, LiAsF6, LiN(CF3SO2)2, a compound salt thereof, or the like may be used.

Note that, in order to improve battery characteristics, the nonaqueous electrolyte solution may contain a radical scavenger, a surface active agent, a flame retardant, and the like.

(5) Characteristics of Nonaqueous Electrolyte Secondary Battery

The nonaqueous electrolyte secondary battery according to the present invention is configured as mentioned above and uses the positive electrode active material according to the present invention, and therefore, for example, in the case where the nonaqueous electrolyte secondary battery is a 2032 type coin battery, a high initial discharge capacity of not less than 150 mAh/g and a low positive electrode resistance of not more than 5 Ω can be achieved and thus the battery has high capacity and high output. Furthermore, compared with a battery using a prior positive electrode active material composed of lithium cobalt oxide or lithium nickel oxide, the nonaqueous electrolyte secondary battery according to the present invention has higher thermal stability and is more excellent in safety.

(6) Use of Nonaqueous Electrolyte Secondary Battery

The nonaqueous electrolyte secondary battery according to the present invention has the above-mentioned characteristics, and therefore is suitable for power sources of small portable electronic equipment (such as notebook-sized personal computers and cell phones) in which high capacity is always required.

Furthermore, the nonaqueous electrolyte secondary battery according to the present invention is suitable also for power sources for driving motors in which high output is required. A larger size battery causes difficulty in securing safety, thereby absolutely requiring an expensive protection circuit, but the nonaqueous electrolyte secondary battery according to the present invention has excellent safety, and therefore not only safety is more easily secured but also an expensive protection circuit is simplified, thereby leading to low cost. Furthermore, since miniaturization and high output can be achieved, the nonaqueous electrolyte secondary battery according to the present invention is suitable as a power source for transport equipment which is under restrictions on loading space.

EXAMPLES

Hereinafter, Examples will explain the present invention in more detail.

In Examples, a composite hydroxide produced by the method according to the present invention and a positive electrode active material produced by using said composite hydroxide as a precursor with the method according to the present invention were examined to confirm the respective average particle diameters and the respective particle size distributions.

Also, for a secondary battery which has a positive electrode using the positive electrode active material produced by the method according to the present invention, its characteristics (initial discharge capacity, positive electrode resistance, and thermal stability) were examined.

The present invention is not limited at all by these Examples.

"Measurement of average particle diameter", "measurement of particle size distribution", "identification and confirmation of crystal structure ", "composition analysis", and "production of secondary battery (including evaluation thereof)" in Examples were performed as follows.

[Measurement of Average Particle Diameter and Particle Size Distribution]

An average particle diameter and a particle size distribution ($[(d_{90}-d_{10})$/average-particle-diameter] value) were calculated from an integrated value of volume measured by a laser diffraction scattering type particle-size-distribution measurement apparatus (Microtrac HRA, manufactured by Nikkiso Co., Ltd.).

[Identification and Confirmation of Crystal Structure]

A crystal structure was identified and confirmed by X-ray diffraction measurement ("X'Pert PRO", manufactured by PANalytical).

[Composition Analysis]

After a sample was dissolved, a composition was analyzed by ICP emission spectrometry.

[Production of Secondary Battery]

For evaluation, a 2032 type coin battery shown in FIG. 5 (hereinafter, referred to as a coin type battery B) was produced and used.

Figure 5:
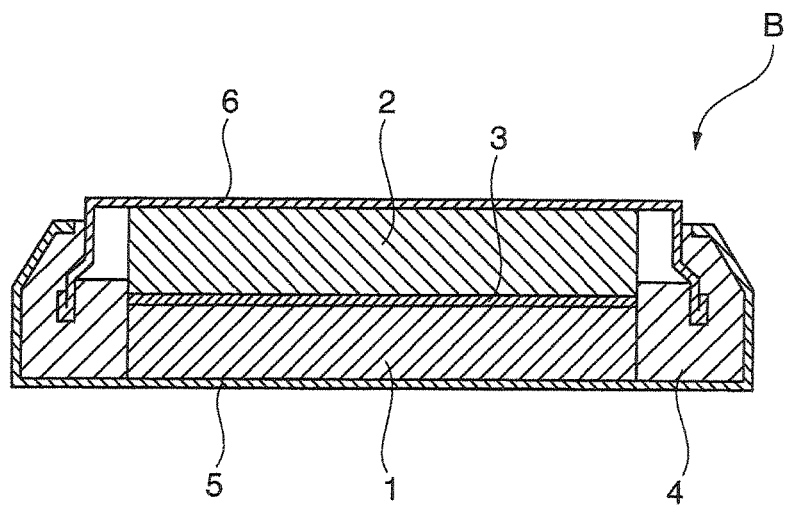
FIG. 5 is a schematic sectional view of a coin-type battery B used for battery evaluation.

As shown in FIG. 5, the coin type battery B is configured with a case (positive electrode can 5 and negative electrode can 6) and an electrode (positive electrode 1 and negative electrode 2) housed in the case.

The case comprises the positive electrode can 5 having a hollow and an opening portion at one end, and the negative electrode can 6 arranged in the opening portion of the positive electrode can 5; and is configured such that, when the negative electrode can 6 is arranged in the opening portion of the positive electrode can 5, a space to house the electrode between the negative electrode can 6 and the positive electrode can 5 is formed.

The electrode comprises the positive electrode 1 and the negative electrode 2, and a separator 3 is interposed between the positive electrode 1 and the negative electrode 2 so that they are laminated. The electrode is housed in the case so that the positive electrode 1 comes into contact with an inner surface of the positive electrode can 5, while the negative electrode 2 comes into contact with an inner surface of the negative electrode can 6.

Note that the case is equipped with a gasket 4, and the gasket 4 allows the positive electrode can 5 and the negative electrode can 6 to be fixed so as to keep an electrically insulating state between the positive electrode can 5 and the negative electrode can 6. The gasket 4 also has a function to seal a gap between the positive electrode can 5 and the negative electrode can 6 to airtightly and fluidtightly separate an interior of the case from an exterior thereof.

The above-mentioned coin type battery B was produced as follows.

First, 52.5 mg of a positive electrode active material for nonaqueous electrolyte secondary batteries, 15 mg of acetylene black, and 7.5 mg of polytetrafluoroethylene resin (PTFE) were mixed, and press-formed at a pressure of 100 MPa to be 11 mm in diameter and 100 μm in thickness, whereby a positive electrode 1 was produced. Next, the obtained positive electrode 1 was dried in a vacuum dryer at 120 degrees C. for 12 hours.

Using this positive electrode 1, a negative electrode 2, a separator 3, and an electrolyte solution, a coin type battery B was produced in a glove box with an Ar atmosphere in which a dew point was controlled at −80 degrees C.

Note that, for the negative electrode 2, there was used a Li metal having a diameter of 17 mm and a thickness of 1 mm. For the separator 3, there was used a porous polyethylene film having a film thickness of 25 μm.

For the electrolyte solution, there was used a mixture solution of ethylene carbonate (EC) and diethyl carbonate (DEC) in equal proportions, wherein 1 M of LiClO4 was used as a supporting electrolyte (manufactured by Tomiyama Pure Chemical Industries, Limited).

For evaluation of characteristics of the obtained coin type battery B, initial discharge capacity, positive electrode resistance, and thermal stability were defined as follows.

Initial discharge capacity was defined in such a manner that the coin type battery B was left to stand for 24 hours after producing thereof; after an open circuit voltage (OCV) was stabilized, with a current density for a positive electrode being set to 0.1 mA/cm$^2$, charging was performed until a cut-off voltage reached 4.3 V; and then, after a 1-hour suspension, discharging was performed until the cut-off voltage reached 3.5 V, and a capacity at the time of this discharging was regarded as an initial discharge capacity.

Figure 6:
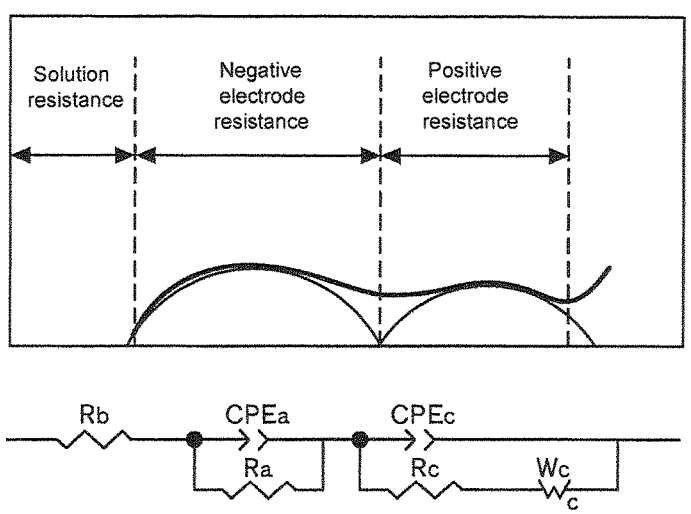
FIG. 6 illustrates a measurement example of alternating current impedance evaluation and an equivalent circuit used for analysis.

Positive electrode resistance was evaluated in such a manner that the coin type battery B was charged to have a charging electric potential of 4.1 V, and, measurement was performed using a frequency response analyzer and a potentiogalvanostat (1255B, manufactured by Solartron) with an alternating-current-impedance method, whereby a Nyquist plot shown in FIG. 6 was produced.

This Nyquist plot is expressed as the sum of characteristic curves representing a solution resistance, a negative electrode resistance and a capacity thereof, and a positive electrode resistance and a capacity thereof, and therefore, based on this Nyquist plot, a fitting calculation was performed using an equivalent circuit to calculate a value of the positive electrode resistance.

Thermal stability was evaluated in such a manner that charging was performed until a charging electric potential reached 4.575 V, and then a coin cell was disassembled and a positive electrode was taken out thereof, and variation in amount of heat between from 80 to 400 degrees C. was measured with a Differential scanning calorimeter (DSC3100SA, manufactured by MAC Science), thereby being evaluated as a heat generation starting temperature.

Example 1

[Composite Hydroxide Particle Production Step]

First, while a reaction vessel (34 L) was filled half full with water and stirred, a temperature in the vessel was set to 40 degrees C., and nitrogen gas was circulated through the reaction vessel to create a nitrogen gas atmosphere. An oxygen concentration in a space inside the reaction vessel at this time was 2.0% by volume, and a concentration of oxygen dissolved in a solution in the reaction vessel was not more than 2 mg/L.

To the water in the reaction vessel, 25% by mass of a sodium hydroxide solution and 25% by mass of aqueous ammonia were added in proper amount to adjust a pH to 12.6 at a reference solution temperature of 25 degrees C. Furthermore, an ammonium ion concentration in a reaction solution was adjusted to 15 g/L.

<Nucleation Stage>

Next, nickel sulfate and cobalt sulfate were dissolved in water to obtain 1.8 mol/L of a mixed solution. This mixed solution was adjusted as to have a molar ratio of metal elements of Ni:Co of 0.82:0.15.

The above-mentioned mixed solution was added to the reaction solution in the reaction vessel at a rate of 88 ml/min. At the same time, 25% by mass of aqueous ammonia and 25% by mass of a sodium hydroxide solution were also added to the reaction solution in the reaction vessel at a constant flow rate, and, in a state where an ammonium ion concentration in the obtained solution for nucleation was maintained at the above-mentioned value, with a pH value being controlled to 12.6 (nucleation pH) at a reference solution temperature of 25 degrees C., crystallization was performed for 2 minutes and 30 seconds to carry out nucleation.

<Particle Growth Stage>

After that, only 25% by mass of the sodium hydroxide solution temporarily stopped being supplied until a pH value of the solution for nucleation reached 11.6 (particle growth pH), whereby a solution for particle growth was obtained.

After a pH value of the obtained solution for particle growth reached 11.6 at a reference solution temperature of 25 degrees C., supply of 25% by mass of the sodium hydroxide solution was resumed, and, with the pH value being maintained at 11.6, particle growth was performed for 2 hours.

When the reaction vessel was filled to capacity, the supply of the sodium hydroxide solution was stopped, and stirring was also stopped, followed by still standing, whereby precipitation of a product was facilitated. Then, after a half amount of a supernatant liquid was taken out from the reaction vessel, the supply of the sodium hydroxide solution was resumed and crystallization was performed for another 2 hours (4 hours in total), and then the particle growth was terminated. Then, the obtained product was water-washed, filtered and dried, whereby composite hydroxide particles were collected.

[Coating Step]

In order that the obtained particles were coated with tungsten and aluminum and had a molar ratio of Ni:Co:Al:W of 82:15:3:0.5, 100 g of hydroxide particles, water, sodium aluminate, and 37 ml of a 30 g/L concentration of an ammonium tungstate solution were put in a 500 mL beaker and mixed to achieve a slurry concentration of 200 g/L at the time of completion of coating. After 3.7 ml of 25% by mass of aqueous ammonia, equivalent to 10% by volume of the ammonium tungstate solution, was added, 8% by mass of sulfuric acid was added so as to achieve a final pH of 8.5 at a normal temperature (25 to 30 degrees C.), thereby performing coating.

Then, a whole amount of a hydroxide slurry in the vessel was filtered and collected, and water-washed by pouring water, and then dried at 120 degrees C. for not less than 12 hours, whereby a composite hydroxide represented by Ni0.82Co0.15Al0.03W0.005(OH)2+α (0≤α≤0.5) was obtained.

A specific surface area of the composite hydroxide was measured by BET method, and was 8.6 m2/g.

[Positive Electrode Active Material Production Step]

<Heat Treatment Step>

The above-mentioned composite hydroxide was heat-treated in an air current (oxygen concentration: 21% by volume) at a temperature of 700 degrees C. for 6 hours to obtain a composite oxide.

<Mixing Step>

Lithium hydroxide was weighed so as to achieve Li/Me of 1.02 (atomic ratio) and mixed with the compound oxide particles obtained above, whereby a lithium mixture was obtained. The mixing was performed using a shaker mixer (TURBULA TypeT2C, manufactured by Willy A. Bachofen (WAB)).

<Burning Step>

The obtained mixture was calcinated in an oxygen current (oxygen concentration: 100% by volume) at 500 degrees C. for 4 hours, and then burned at 730 degrees C. for 24 hours, and after being cooled, pulverized, whereby a positive electrode active material was obtained. The positive electrode active material had a composition of $Li_{1.02}Ni_{0.816}Co_{0.149}Al_{0.030}W_{0.005}O_2$. A specific surface area of the positive electrode active material was measured by BET method, and was 0.67 m$^2$/g.

Table 1 shows average particle diameters, $[(d_{90}-d_{10})/$average-particle-diameter] values, positive electrode resistance, and thermal stability of the obtained composite hydroxide and the obtained positive electrode active material for nonaqueous electrolyte secondary batteries.

Example 2

A positive electrode active material for nonaqueous electrolyte secondary batteries was obtained and evaluated in the same manner as in Example 1, except that, in the composite hydroxide particle production step, a mixed solution was prepared so as to have a molar ratio of metal elements of Ni:Co:Ti of 82:15:1 and crystallized, and coating was performed so as to achieve a molar ratio of Ni:Co:Ti:Al:W of 82:15:1:2:0.5.

The positive electrode active material had a composition of $Li_{1.02}Ni_{0.816}Cu_{0.149}Ti_{0.010}Al_{0.020}W_{0.005}O_2$.

Specific surface areas of the composite hydroxide and the positive electrode active material were measured by BET method, and were 8.9 m$^2$/g and 0.72 m$^2$/g, respectively.

Table 1 shows average particle diameters, $[(d_{90}-d_{10})/$average-particle-diameter] values, positive electrode resistance, and thermal stability of the obtained composite hydroxide and the obtained positive electrode active material for nonaqueous electrolyte secondary batteries.

Example 3

A positive electrode active material for nonaqueous electrolyte secondary batteries was obtained and evaluated in the same manner as in Example 1, except that, in the composite hydroxide particle production step, a mixed solution was prepared so as to have a molar ratio of metal elements of Ni:Co:Zr of 82:15:0.5 and crystallized, and coating was performed so as to achieve a molar ratio of Ni:Co:Zr:Al:W of 82:15:0.5:2:0.5.

The positive electrode active material had a composition of $Li_{1.02}Ni_{0.82}Co_{0.15}Al_{0.02}Zr_{0.005}W_{0.005}O_2$.

Specific surface areas of the composite hydroxide and the positive electrode active material were measured by BET method, and were 9.0 m$^2$/g and 0.77 m$^2$/g, respectively.

Table 1 shows average particle diameters, $[(d_{90}-d_{10})/$average-particle-diameter] values, positive electrode resistance, and thermal stability of the obtained composite hydroxide and the obtained positive electrode active material for nonaqueous electrolyte secondary batteries.

Example 4

A positive electrode active material for nonaqueous electrolyte secondary batteries was obtained and evaluated in the same manner as in Example 1, except that, in the composite hydroxide particle production step, a mixed solution was prepared so as to have a molar ratio of metal elements of Ni:Co:Mn of 8:1:1 and crystallized and coating was performed so as to achieve a molar ratio of Ni:Co:Mn:W of 80:10:10:0.5; and in the positive electrode active material production step, the heat treatment temperature was set to 550 degrees C., the mixing was performed so as to achieve Li/Me of 1.10, and the burning temperature was set to 800 degrees C.

The positive electrode active material had a composition of $Li1.10Ni0.796Cu0.100Mn0.100W0.005O2$.

Specific surface areas of the composite hydroxide and the positive electrode active material were measured by BET method, and were 12.1 m2/g and 1.05 m2/g, respectively.

Table 1 shows average particle diameters, [(d90–d10)/average-particle-diameter] values, positive electrode resistance, and thermal stability of the obtained composite hydroxide and the obtained positive electrode active material for nonaqueous electrolyte secondary batteries.

Example 5

[Composite Hydroxide Particle Production Step]

While a small type reaction vessel (5 L) was filled half full with water and stirred, a temperature in the vessel was set to 40 degrees C. Into the reaction vessel, 25% by mass of a sodium hydroxide solution and 25% by mass of aqueous ammonia were added in proper amount thereby to adjust a pH to 12.6 at a reference solution temperature of 25 degrees C. and adjust an ammonium ion concentration in a reaction solution to 10 g/L.

<Nucleation Stage>

Next, 1.8 mol/L of a mixed solution obtained by dissolving nickel sulfate and cobalt sulfate (a molar ratio of metal elements of Ni:Co of 82:15) in water, and 25% by mass of aqueous ammonia and 25% by mass of a sodium hydroxide solution were added to the above-mentioned reaction solution at a constant flow rate thereby to obtain a solution for nucleation, and in a state where an ammonium ion concentration in the obtained solution for nucleation was maintained at the above-mentioned value, with a pH value being controlled to 12.6 (nucleation pH) at a reference solution temperature of 25 degrees C., a sodium hydroxide solution was added for 2 minutes and 30 seconds thereby to obtain a seed crystal.

<Particle Growth Stage>

While another reaction vessel (34 L) was filled half full with water and stirred, a temperature in the vessel was set to 40 degrees C., and nitrogen gas was circulated therethrough to create a nitrogen gas atmosphere. An oxygen concentration in a space inside the reaction vessel at this time was 2.0% by volume.

To the water in the reaction vessel, 25% by mass of a sodium hydroxide solution and 25% by mass of aqueous ammonia were added in proper amount to adjust a pH to 11.6 at a reference solution temperature of 25 degrees C. Furthermore, an ammonium ion concentration in a reaction solution was adjusted to 10 g/L. The reaction solution containing the seed crystal obtained in the small type reaction vessel was fed into the reaction vessel, and then, in a state where an ammonium ion concentration in the solution for particle growth was maintained at the above-mentioned value, with the pH value being controlled to 11.6, the above-mentioned mixed solution, the aqueous ammonia, and the sodium hydroxide solution continued to be added for 2 hours to perform particle growth.

When the reaction vessel was filled to capacity, the supply of the aqueous ammonia and the sodium hydroxide solution were stopped, and stirring was also stopped, followed by still standing, whereby precipitation of a product was facilitated. After the product was precipitated and then a half amount of supernatant liquid was taken out from the reaction vessel, the supply of the aqueous ammonia and the sodium hydroxide solution were resumed. The aqueous ammonia and the sodium hydroxide solution were supplied for another 2 hours (4 hours in total), and then the supply of them was terminated, and the obtained particles were water-washed, filtered and dried, and then collected.

[Coating Step]

A composite hydroxide was obtained by coating in the same manner as in Example 1, except that the obtained particles were coated and had a molar ratio of Ni:Co:Al:W of 82:15:3:1.

The remainder steps were performed in the same manner as in Example 1, whereby a positive electrode active material for nonaqueous electrolyte secondary batteries was obtained and evaluated.

The positive electrode active material had a composition of $Li_{1.02}Ni_{0.812}Cu_{0.149}Al_{0.030}W_{0.010}O_2$.

Specific surface areas of the composite hydroxide and the positive electrode active material were measured by BET method, and were 9.0 m2/g and 0.82 m2/g, respectively.

Table 1 shows average particle diameters, [(d90−d10)/average-particle-diameter] values, positive electrode resistance, and thermal stability of the obtained composite hydroxide and the obtained positive electrode active material for nonaqueous electrolyte secondary batteries.

Comparative Example 1

A positive electrode active material for nonaqueous electrolyte secondary batteries was obtained and evaluated in the same manner as in Example 1, except that, in the coating step, an ammonia solution was not added, and the coating is performed so as to achieve a molar ratio of Ni:Co:Al of 82:15:3.

The positive electrode active material had a composition of $Li_{1.02}Ni_{0.82}Cu_{0.15}Al_{0.03}O_2$.

Specific surface areas of the composite hydroxide and the positive electrode active material were measured by BET method, and were 8.6 m2/g and 0.70 m2/g, respectively.

Table 1 shows average particle diameters, [(d90−d10)/average-particle-diameter] values, positive electrode resistance, and thermal stability of the obtained composite hydroxide and the obtained positive electrode active material for nonaqueous electrolyte secondary batteries.

TABLE 1

|  | Composite hydroxide | | | | | Positive electrode active material | | | | DSC heat generation starting temperature [° C.] |
| --- | --- | --- | --- | --- | --- | --- | --- | --- | --- | --- |
|  | Average particle diameter [μm] | $(d_{90}-d_{10})/$ average particle diameter | Li/Me | s | s + t | Average particle diameter [μm] | $(d_{90}-d_{10})/$ average particle diameter | Initial discharge capacity [mAh·g$^{-1}$] | Positive electrode resistance [Ω] |  |
| Example 1 | 4.5 | 0.48 | 1.02 | 0.005 | 0.035 | 4.6 | 0.55 | 191.1 | 2.3 | 198 |
| Example 2 | 4.1 | 0.49 | 1.02 | 0.005 | 0.035 | 4.3 | 0.52 | 190.9 | 2.0 | 199 |
| Example 3 | 3.9 | 0.50 | 1.02 | 0.005 | 0.030 | 4.4 | 0.55 | 190.3 | 2.2 | 197 |
| Example 4 | 4.3 | 0.51 | 1.10 | 0.005 | 0.005 | 4.7 | 0.59 | 188.1 | 3.0 | 202 |
| Example 5 | 4.1 | 0.47 | 1.10 | 0.010 | 0.040 | 4.3 | 0.58 | 191.2 | 2.3 | 199 |
| Comparative Example 1 | 4.5 | 0.48 | 1.02 | 0 | 0.030 | 4.5 | 0.56 | 191.0 | 3.9 | 197 |

(Evaluation)

It is found that Examples 1 to 5, which have the respective average particle diameters and the respective average particle size distributions according to the present invention and to which tungsten was added, have higher capacity and lower positive electrode resistance and are suitable as positive electrode active materials for nonaqueous electrolyte secondary batteries. On the other hand, it is found that Comparative Example 1, to which tungsten was not added, has higher capacity but has higher positive electrode resistance, and hence output characteristics are not sufficient.

Example 6

[Hydroxide Particle Production Step]

First, while a reaction vessel was filled half full with water and stirred, a temperature in the vessel was set to 40 degrees C., and nitrogen gas was circulated through the reaction vessel to create a nitrogen gas atmosphere. An oxygen concentration in a space inside the reaction vessel at this time was 3.0% by volume, and a concentration of oxygen dissolved in a solution in the reaction vessel was not more than 2 mg/L. To the solution in the reaction vessel, 25% by mass of a sodium hydroxide solution and 25% by mass of aqueous ammonia were added in proper amount to adjust a pH to 12.6 at a reference solution temperature of 25 degrees C., and an ammonia concentration in the solution was adjusted to 10 g/L. To the obtained solution, 2.0 mol/L of a solution obtained by dissolving nickel sulfate and manganese sulfate (a molar ratio of metal elements of Ni:Mn of 50:50) in water, and 25% by mass of aqueous ammonia and 25% by mass of a sodium hydroxide solution were added at a constant flow rate, and, with a pH value being controlled to 12.6 (nucleation pH), crystallization was performed for 2 minutes and 30 seconds.

After that, only the supply of 25% by mass of the sodium hydroxide solution was temporarily stopped until a pH value reached 11.6 (nucleus growth pH) at a reference solution temperature of 25 degrees C., and after the pH value reached 11.6 at a reference solution temperature of 25 degrees C., the supply of 25% by mass of the sodium hydroxide solution was resumed. With the pH value being maintained at 11.6 and the pH fluctuation range being controlled within plus and minus 0.2 of a predetermined value, crystallization was continued for 2 hours, and at the time when the reaction vessel was filled to capacity, the crystallization was stopped, and stirring was also stopped, followed by still standing, whereby precipitation of a product was facilitated. Then, after a half amount of supernatant liquid was taken out from the reaction vessel, the crystallization was resumed.

The crystallization was performed for another 2 hours (4 hours in total), and then the crystallization was terminated, and the product was water-washed, filtered and dried. By the above-mentioned method, composite hydroxide particles represented by $Ni_{0.50}Mn_{0.50}(OH)_2+\alpha$ ($0 \leq \alpha \leq 0.5$) were obtained.

[Coating Step]

In order that the obtained particles were coated with tungsten and had a molar ratio of Ni:Mn:W of 49.75:49.75:0.5, 100 g of the hydroxide particles, water, and 37 ml of a 30 g/L concentration of an ammonium tungstate solution were put in a 500 mL beaker and mixed to achieve a slurry concentration of 200 g/L at the time of completion of coating. After 3.7 ml of 25% by mass of aqueous ammonia, equivalent to 10% by volume of the ammonium tungstate solution, was added, 8% by mass of sulfuric acid was added so as to achieve a final pH value of 8.5 at a normal temperature, thereby performing coating.

Then, a whole amount of hydroxide slurry in the vessel was filtered and collected, and water-washed by pouring water, and then dried at 120 degrees C. for not less than 12 hours, whereby a composite hydroxide represented by $Ni_{0.498}Mn_{0.498}W_{0.005}(OH)_2+\alpha$ ($0 \leq \alpha < 0.5$) was obtained. A specific surface area of the composite hydroxide was measured by BET method, and was 20.2 m2/g.

[Positive Electrode Active Material Production Step]

<Heat Treatment Step>

The above-mentioned composite hydroxide was heat-treated in an air current (oxygen concentration: 21% by volume) at a temperature of 700 degrees C. for 6 hours to obtain a composite oxide.

<Mixing Step>

Lithium carbonate was weighed so as to achieve Li/Me of 1.35 and sufficiently mixed with the obtained compound oxide by a shaker mixer (TURBULA TypeT2C, manufactured by Willy A. Bachofen (WAB)) to obtain a lithium mixture.

<Burning Step>

The obtained lithium mixture was calcinated in an air current (oxygen concentration: 21% by volume) at 400 degrees C. for hours, and then burned at 980 degrees C. for 10 hours, and pulverized to obtain a positive electrode active material for nonaqueous electrolyte secondary batteries.

The positive electrode active material had a composition of $Li_{1.35}Ni_{0.498}Mn_{0.498}W_{0.005}O_2$.

A specific surface area of the positive electrode active material was measured by BET method, and was 1.4 m2/g.

Figure 7:
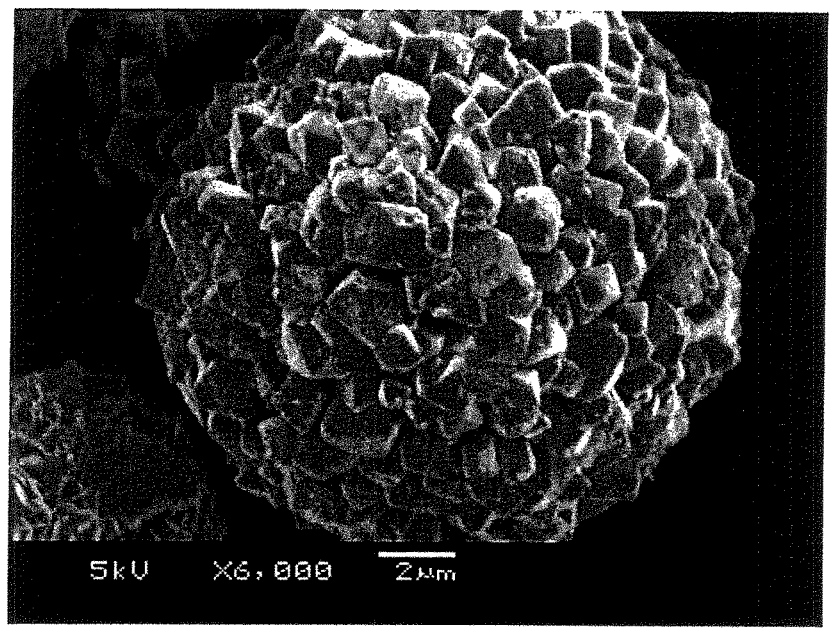
FIG. 7 is a FE-SEM photograph of a lithium transition metal composite hydroxide (positive electrode active material) according to the present invention (at an observation magnification of 1,000×).

Table 2 shows average particle diameters, [(d90−d10)/average-particle-diameter] values, positive electrode resistance, and thermal stability of the obtained composite hydroxide and the obtained positive electrode active material for nonaqueous electrolyte secondary batteries. FIG. 7 shows SEM (scanning electron microscope JSM-6360LA, manufactured by JEOL Ltd.) observation results of the positive electrode active material.

Example 7

A positive electrode active material for nonaqueous electrolyte secondary batteries was obtained and evaluated in the same manner as in Example 6, except that, in the coating step, the mixing was performed so as to achieve a molar ratio of Ni:Mn:W of 47.5:47.5:5, and 37 ml of 25% by mass of aqueous ammonia, equivalent to 10% by volume of 370 ml of an ammonium tungstate solution, was added.

The obtained composite hydroxide had a composition of $Ni_{0.475}Mn_{0.475}W_{0.05}(OH)_2+\alpha$ ($0 \leq \alpha \leq 0.5$), and the positive electrode active material had a composition of $Li_{1.35}Ni_{0.475}Mn_{0.475}W_{0.05}O_2$.

Specific surface areas of the composite hydroxide and the positive electrode active material were measured by BET method, and were 21.9 m2/g and 1.5 m2/g, respectively.

Table 2 shows average particle diameters, [(d90−d10)/average-particle-diameter] values, positive electrode resistance, and thermal stability of the obtained composite hydroxide and the obtained positive electrode active material for nonaqueous electrolyte secondary batteries.

Example 8

A positive electrode active material for nonaqueous electrolyte secondary batteries was obtained and evaluated in the same manner as in Example 6, except that, in the coating step, the mixing was performed so as to achieve a molar ratio of Ni:Mn:Al:W of 48.3:48.3:3:0.5.

The obtained composite hydroxide had a $Ni_{0.483}Mn_{0.483}Al_{0.03}W_{0.005}(OH)_2+\alpha$ ($0 \leq \alpha \leq 0.5$), and the positive electrode active material had a composition of $Li_{1.35}Ni_{0.483}Mn_{0.483}Al_{0.03}W_{0.05}O_2$.

Specific surface areas of the composite hydroxide and the positive electrode active material were measured by BET method, and were 26.3 m2/g and 1.4 m2/g, respectively.

Table 2 shows average particle diameters, [(d90−d10)/average-particle-diameter] values, positive electrode resistance, and thermal stability of the obtained composite hydroxide and the obtained positive electrode active material for nonaqueous electrolyte secondary batteries.

Comparative Example 2

A positive electrode active material for nonaqueous electrolyte secondary batteries was obtained and evaluated in the same manner as in Example 6, except that the final pH value was controlled to 11.

Tungsten was not precipitated, the obtained composite hydroxide had a composition of $Ni_{0.50}Mn_{0.50}(OH)_2+\alpha$ ($0 \leq \alpha \leq 0.5$), and the positive electrode active material had a composition of $Li_{1.35}Ni_{0.50}Mn_{0.50}O_2$.

Specific surface areas of the composite hydroxide and the positive electrode active material were measured by BET method, and were 21.1 m2/g and 1.3 m2/g, respectively.

Table 2 shows average particle diameters, [(d90−d10)/average-particle-diameter] values, positive electrode resistance, and thermal stability of the obtained composite hydroxide and the obtained positive electrode active material for nonaqueous electrolyte secondary batteries.

Comparative Example 3

A positive electrode active material for nonaqueous electrolyte secondary batteries was obtained and evaluated in the same manner as in Example 6, except that the final pH value was controlled to 5.

A part of hydroxide particles dissolved in the coating step, and accordingly, subsequent processes were discontinued. A specific surface area of the composite hydroxide after the coating step was measured by BET method, and was 31.5 m$^2$/g.

hydroxide and the obtained positive electrode active material for nonaqueous electrolyte secondary batteries.

Example 10

A positive electrode active material for nonaqueous electrolyte secondary batteries was obtained and evaluated in the same manner as in Example 9, except that, in the coating step, the mixing was performed so as to achieve a molar ratio of Ni:Co:Mn:W of 31.7:31.7:31.7:5, and 3.7 ml of 25% by mass of aqueous ammonia, equivalent to 1% by volume of 370 ml of an ammonium tungstate solution, was added.

A small amount of tungsten remained in the slurry, and consequently the obtained composite hydroxide had a com-

TABLE 2

| | Composite hydroxide | | | | | Positive electrode active material | | | | DSC heat generation starting temperature [° C.] |
|---|---|---|---|---|---|---|---|---|---|---|
| | Average particle diameter [μm] | $(d_{90}-d_{10})$/average particle diameter | Li/Me | s | s + t | Average particle diameter [μm] | $(d_{90}-d_{10})$/average particle diameter | Initial discharge capacity [mAh · g$^{-1}$] | Positive electrode resistance [Ω] | |
| Example 6 | 5.5 | 0.46 | 1.35 | 0.005 | 0.005 | 5.6 | 0.51 | 201.1 | 5.6 | 215 |
| Example 7 | 5.5 | 0.46 | 1.35 | 0.050 | 0.050 | 5.7 | 0.52 | 200.5 | 5.4 | 220 |
| Example 8 | 5.5 | 0.46 | 1.35 | 0.005 | 0.035 | 5.6 | 0.51 | 195.7 | 5.9 | 233 |
| Comparative Example 2 | 5.5 | 0.46 | 1.35 | 0 | 0 | 5.4 | 0.51 | 200.9 | 8.5 | 223 |

(Evaluation)

It is found that Examples 6 to 8, which have the respective average particle diameters and the respective particle size distributions according to the present invention and to which tungsten was added, have higher capacity and lower positive electrode resistance and are suitable as positive electrode active materials for nonaqueous electrolyte secondary batteries. On the other hand, it is found that Comparative Example 2, to which tungsten was not added, has considerably higher positive electrode resistance and hence has a problem as a positive electrode active material for nonaqueous electrolyte secondary batteries.

Example 9

A positive electrode active material for nonaqueous electrolyte secondary batteries was obtained and evaluated in the same manner as in Example 6, except that, in the composite hydroxide production step, a mixed solution was prepared so as to have a molar ratio of metal elements of Ni:Co:Mn of 33:33:33 and crystallized; in the coating step, coating was performed so as to achieve a molar ratio of Ni:Co:Mn:W of 33.1:33.1:33.1:0.5; and in the positive electrode active material production step, the heat treatment was not performed, the mixing was performed so as to achieve Li/Me of 1.15, the calcination temperature was set to 760 degrees C., and the burning temperature was set to 900 degrees C.

The obtained composite hydroxide had a composition of $Ni_{0.331}Co_{0.331}Mn_{0.331}W_{0.005}(OH)_{2+\alpha}$ ($0 \leq \alpha \leq 0.5$), and the positive electrode active material had a composition of $Li_{1.15}Ni_{0.331}Co_{0.331}Mn_{0.331}W_{0.005}O_2$.

Specific surface areas of the composite hydroxide and the positive electrode active material were measured by BET method, and were 19.1 m2/g and 1.0 m2/g, respectively.

Table 3 shows average particle diameters, [(d90–d10)/average-particle-diameter] values, positive electrode resistance, and thermal stability of the obtained composite hydroxide and the obtained positive electrode active material for nonaqueous electrolyte secondary batteries.

Example 11

A positive electrode active material for nonaqueous electrolyte secondary batteries was obtained and evaluated in the same manner as in Example 9, except that, in the coating step, the mixing was performed so as to achieve a molar ratio of Ni:Co:Mn:Al:W of 32.2:32.2:32.2:3:0.5.

The obtained composite hydroxide had a composition of $Ni_{0.322}Cu_{0.322}Mn_{0.322}Al_{0.03}W_{0.005}(OH)_{2+\alpha}$ ($0 \leq \alpha \leq 0.5$), and the positive electrode active material had a composition of $Li_{1.15}Ni_{0.322}Cu_{0.321}Mn_{0.322}Al_{0.03}W_{0.005}O_2$.

Specific surface areas of the composite hydroxide and the positive electrode active material were measured by BET method, and were 18.2 m2/g and 0.97 m2/g, respectively.

Table 3 shows average particle diameters, [(d90–d10)/average-particle-diameter] values, positive electrode resistance, and thermal stability of the obtained composite hydroxide and the obtained positive electrode active material for nonaqueous electrolyte secondary batteries.

Example 12

A positive electrode active material for nonaqueous electrolyte secondary batteries was obtained and evaluated in the same manner as in Example 11, except that, in the coating step, the mixing was performed using sodium tungstate instead of ammonium tungstate so as to achieve a molar ratio of Ni:Co:Mn:Al:W of 32.2:32.2:32.2:3:0.5, and ammonia was not added.

The obtained composite hydroxide had a composition of $Ni_{0.322}Cu_{0.322}Mn_{0.322}Al_{0.03}W_{0.005}(OH)_{2+\alpha}$ ($0 \leq \alpha \leq 0.5$), and the positive electrode active material had a composition of $Li_{1.15}Ni_{0.322}Cu_{0.322}Mn_{0.322}Al_{0.03}W_{0.005}O_2$.

Specific surface areas of the composite hydroxide and the positive electrode active material were measured by BET method, and were 19.5 m2/g and 1.1 m2/g, respectively.

Table 3 shows average particle diameters, [(d90−d10)/average-particle-diameter] values, positive electrode resistance, and thermal stability of the obtained composite hydroxide and the obtained positive electrode active material for nonaqueous electrolyte secondary batteries.

Comparative Example 4

To a 5-liter cylinder-type reaction vessel (a modified cylindrical container made of stainless steel) equipped with a stirrer and a overflow pipe, pure water and 25% by mass of a sodium hydroxide solution (an extra-pure reagent, manufactured by Wako Pure Chemical Industries, Ltd.) were added so as to achieve a pH of 11.3, and, with a temperature being maintained at 35 degrees C., stirring was performed at a constant flow rate. Next, a mixed solution was added at a flow rate of 4 ml/min, the mixed solution being obtained by mixing a nickel sulfate solution (an extra-pure reagent, manufactured by Wako Pure Chemical Industries, Ltd.), a cobalt sulfate solution (an extra-pure reagent, manufactured by Wako Pure Chemical Industries, Ltd.), and a manganese sulfate solution (an extra-pure reagent, manufactured by Wako Pure Chemical Industries, Ltd.) so as to achieve an atomic ratio of Ni:Co:Mn of 1:1:1 and have a total salt concentration of 2 mol/L. At the same time, 25% by mass of aqueous ammonia (an extra-pure reagent, manufactured by Wako Pure Chemical Industries, Ltd.) was added to the reaction vessel as a complexing agent at a flow rate of 0.4 ml/min. Furthermore, 25% by mass of a sodium hydroxide solution was intermittently added so as to control a pH value of a reaction solution to 11.5 to 12.0 at a reference solution temperature of 25 degrees C., whereby nickel-cobalt-manganese composite hydroxide particles were formed.

After the state inside the reaction vessel became stationary, the nickel-cobalt-manganese composite hydroxide particles were continuously collected from the overflow pipe, water-washed, and filtered, and then air-dried at 120 degrees C. for 24 hours, whereby nickel cobalt manganese composite hydroxide particles were obtained. A pH of a post-reaction solution was measured and as a result, was 11.85 at a reference solution temperature of 25 degrees C.

In subsequent processes, the same manner as in Example 9 was applied to obtain and evaluate a positive electrode active material for nonaqueous electrolyte secondary batteries.

The obtained composite hydroxide had a composition of $Ni_{0.332}Cu_{0.332}Mn_{0.332}W_{0.005}(OH)_{2+\alpha}$ ($0 \leq \alpha \leq 0.5$), and the positive electrode active material had a composition of $Li_{1.15}Ni_{0.332}Cu_{0.332}Mn_{0.332}W_{0.005}O_2$.

Specific surface areas of the composite hydroxide and the positive electrode active material were measured by BET method, and were 31.8 m2/g and 2.1 m2/g, respectively.

Table 3 shows average particle diameters, [(d90−d10)/average-particle-diameter] values, positive electrode resistance, and thermal stability of the obtained composite hydroxide and the obtained positive electrode active material for nonaqueous electrolyte secondary batteries.

Comparative Example 5

A positive electrode active material for nonaqueous electrolyte secondary batteries was obtained and evaluated in the same manner as in Example 9, except that the coating step was not performed and accordingly the composite hydroxide particles were not coated with tungsten.

The obtained composite hydroxide had a composition of $Ni_{0.333}Cu_{0.333}Mn_{0.333}(OH)_{2+\alpha}$ ($0 \leq \alpha \leq 0.5$), and the positive electrode active material had a composition of $Li_{1.15}Ni_{0.333}Cu_{0.333}Mn_{0.333}O_2$.

Specific surface areas of the composite hydroxide and the positive electrode active material were measured by BET method, and were 19.7 m2/g and 1.5 m2/g, respectively.

Table 3 shows average particle diameters, [(d90−d10)/average-particle-diameter] values, positive electrode resistance, and thermal stability of the obtained composite hydroxide and the obtained positive electrode active material for nonaqueous electrolyte secondary batteries.

Comparative Example 6

A positive electrode active material for nonaqueous electrolyte secondary batteries was obtained and evaluated in the same manner as in Example 9, except that, in the coating step, the mixing was performed so as to achieve a molar ratio of Ni:Co:Mn:Al of 32.3:32.3:32.3:3, and aqueous ammonia was not added.

The obtained composite hydroxide had a composition of $Ni_{0.323}Cu_{0.323}Mn_{0.323}Al_{0.03}(OH)_{2+\alpha}$ ($0 \leq \alpha \leq 0.5$), and the positive electrode active material had a composition of $Li_{1.15}Ni_{0.32}Cu_{0.32}Mn_{0.32}Al_{0.03}O_2$.

Specific surface areas of the composite hydroxide and the positive electrode active material were measured by BET method, and were 20.5 m2/g and 1.6 m2/g, respectively.

Table 3 shows average particle diameters, [(d90−d10)/average-particle-diameter] values, positive electrode resistance, and thermal stability of the obtained composite hydroxide and the obtained positive electrode active material for nonaqueous electrolyte secondary batteries.

TABLE 3

| | Composite hydroxide | | | | | Positive electrode active material | | | | DSC heat |
|---|---|---|---|---|---|---|---|---|---|---|
| | Average particle diameter [μm] | $(d_{90}-d_{10})/$ average particle diameter | Li/Me | s | s + t | Average particle diameter [μm] | $(d_{90}-d_{10})/$ average particle diameter | Initial discharge capacity [mAh·g$^{-1}$] | Positive electrode resistance [Ω] | generation starting temperature [°C.] |
| Example 9 | 5.4 | 0.47 | 1.15 | 0.005 | 0.005 | 5.1 | 0.42 | 157.1 | 2.9 | 220 |
| Example 10 | 5.4 | 0.47 | 1.15 | 0.036 | 0.036 | 5.2 | 0.42 | 156.9 | 2.9 | 224 |
| Example 11 | 5.4 | 0.47 | 1.15 | 0.005 | 0.035 | 5.3 | 0.43 | 151.6 | 3.3 | 238 |
| Example 12 | 5.4 | 0.47 | 1.15 | 0.005 | 0.035 | 5.3 | 0.43 | 150.8 | 3.4 | 240 |
| Comparative Example 4 | 10.8 | 0.89 | 1.15 | 0.005 | 0.005 | 10.1 | 0.86 | 154.3 | 3.8 | 232 |
| Comparative Example 5 | 5.4 | 0.47 | 1.15 | 0 | 0.000 | 5.1 | 0.42 | 156.2 | 5.2 | 219 |
| Comparative Example 6 | 5.4 | 0.47 | 1.15 | 0 | 0.030 | 5.2 | 0.43 | 151.1 | 5.4 | 238 |

(Evaluation)

It is found that the positive electrode active materials in Examples 9 to 12, which have the respective average particle diameters and the respective particle size distributions according to the present invention and to which tungsten was added, have higher capacity and lower positive electrode resistance and are suitable as positive electrode active materials for nonaqueous electrolyte secondary batteries.

On the other hand, it is found that Comparative Example 4, having a larger average particle diameter and a wider particle size distribution, has the same level of battery capacity as Examples 9 to 12, but has higher positive electrode resistance, and accordingly insufficient output characteristics. Also, it is found that Comparative Examples 5 and 6, to which tungsten was not added, have considerably higher positive electrode resistance, and hence have a problem as positive electrode active materials for nonaqueous electrolyte secondary batteries.

The invention claimed is:

1. A method for producing a transition metal composite hydroxide, the transition metal composite hydroxide being represented by a general formula (1) $M_xW_sA_t(OH)_{2+\alpha}$ (wherein, x+s+t=1, 0 <s≤0.05, 0 <s+t≤0.15, 0 ≤α≤0.5, M is at least one transition metal selected from Ni, Co and Mn, and A is at least one additive element selected from transition metal elements other than M and W, group 2 elements, and group 13 elements), being coated with a compound containing the additive element, and serving as a precursor of a positive electrode active material for nonaqueous electrolyte secondary batteries, the method comprising:
a composite hydroxide particle production step including a nucleation stage and a particle growth stage,
the nucleation stage being such that a solution for nucleation containing a metal compound having an atomic ratio of transition metals corresponding to an atomic ratio of M in the transition metal composite hydroxide, and an ammonium ion supply source is controlled to have a pH of 12.0 to 14.0 at a reference solution temperature of 25 degrees C., whereby nuclei are formed,
the particle growth stage being such that a solution for particle growth containing nuclei formed at the nucleation stage is controlled to have a pH of 10.5 to 12.0 at a reference solution temperature of 25 degrees C. so as to have a pH lower than the pH at the nucleation stage, whereby the nuclei are grown; and
a coating step wherein composite hydroxide particles obtained in the particle production step are mixed with a solution containing at least a tungsten compound to make a slurry, and the slurry is controlled to have a pH of 7 to 9 at a reference solution temperature of 25 degrees C., whereby a coating material containing a metal oxide of tungsten and the additive element or a metal hydroxide of tungsten and the additive element is formed on surfaces of said composite hydroxide particles.

2. The method for producing a transition metal composite hydroxide according to claim 1, wherein the additive element is at least one element selected from B, Al, Sc, Y, Ti, Zr, Hf, V, Nb, Ta, Cr, and Mo.

3. The method for producing a transition metal composite hydroxide according to claim 2, wherein the additive element includes at least Al.

4. The method for producing a transition metal composite hydroxide according to claim 3, wherein the tungsten compound is either or both of ammonium tungstate and sodium tungstate.

5. The method for producing a transition metal composite hydroxide according to claim 4, wherein the tungsten compound in the coating step is ammonium tungstate, and ammonia contained in a 25% ammonia solution in an amount equivalent to 0.5 to 25% by volume of an ammonium tungstate saturated solution is added to the slurry.

6. The method for producing a transition metal composite hydroxide according to claim 3, wherein sodium aluminate is added to the slurry in the coating step.

7. The method for producing a transition metal composite hydroxide according to claim 6, wherein pH is controlled by adding sulfuric acid to the slurry in the coating step to precipitate a tungsten compound and an aluminum compound simultaneously, whereby a surface of the composite hydroxide is coated.

8. A method for producing a positive electrode active material for nonaqueous electrolyte secondary batteries, the positive electrode active material comprising a lithium transition metal composite oxide represented by a general formula (2) $Li_{1+u}M_xW_sA_tO_2$ (wherein, −0.05 ≤u≤0.50, x+s+t=1, 0 <s≤0.05, 0 <s+t ≤0.15, M is at least one transition metal selected from Ni, Co and Mn, and A is at least one additive element selected from transition metal elements other than M and W, group 2 elements, and group 13 elements) and having a layered hexagonal crystal structure, the method comprising:
- a hydroxide particle production step of obtaining a transition metal composite hydroxide by the production method according to claim 1;
- a mixing step of mixing the transition metal composite hydroxide with a lithium compound to form a lithium mixture; and
- a burning step of burning the lithium mixture formed in the mixing step under an oxidizing atmosphere at a temperature of 700to 1000 degrees C.

9. The method for producing a positive electrode active material for nonaqueous electrolyte secondary batteries according to claim 8, wherein the lithium mixture is adjusted so that a ratio of a total number of atoms of metals other than lithium contained in said lithium mixture to the number of atoms of lithium contained therein is 1:0.95 to 1:1.50.

10. The method of producing a positive electrode active material for nonaqueous electrolyte secondary batteries according to claim 8, wherein, in the burning step, calcination is performed in advance at a temperature of 350 to 800 degrees C. before the burning.

* * * * *